United States Patent
Ninomiya et al.

(10) Patent No.: US 9,165,772 B2
(45) Date of Patent: Oct. 20, 2015

(54) ION IMPLANTATION METHOD AND ION IMPLANTATION APPARATUS

(71) Applicant: SEN Corporation, Shinagawa-ku, Tokyo (JP)

(72) Inventors: Shiro Ninomiya, Tokyo (JP); Tetsuya Kudo, Tokyo (JP); Akihiro Ochi, Tokyo (JP)

(73) Assignee: SEN CORPORATION, Tokyo (JP)

(*) Notice: Subject to any disclaimer, the term of this patent is extended or adjusted under 35 U.S.C. 154(b) by 0 days.

(21) Appl. No.: 14/259,889

(22) Filed: Apr. 23, 2014

(65) Prior Publication Data
US 2014/0235042 A1    Aug. 21, 2014

Related U.S. Application Data

(62) Division of application No. 13/426,423, filed on Mar. 21, 2012, now Pat. No. 8,772,142.

(30) Foreign Application Priority Data

Mar. 23, 2011    (JP) ................................. 2011-064666

(51) Int. Cl.
| | |
|---|---|
| *H01L 21/66* | (2006.01) |
| *G01R 31/26* | (2014.01) |
| *H01L 21/265* | (2006.01) |
| *C23C 14/48* | (2006.01) |
| *C23C 14/54* | (2006.01) |
| *H01J 37/302* | (2006.01) |
| *H01J 37/317* | (2006.01) |
| *H01J 37/30* | (2006.01) |

(52) U.S. Cl.
CPC .............. *H01L 21/265* (2013.01); *C23C 14/48* (2013.01); *C23C 14/542* (2013.01);
(Continued)

(58) Field of Classification Search
CPC ......... H02L 22/20; H02L 22/12; H02L 22/34; H02L 22/26; H02L 23/544; H02L 21/26513; H02L 21/265; H02L 21/266; H02L 29/6659; H02L 21/26586; H02L 21/26506; H02L 29/66659; H02L 29/7835; H02L 21/823807; H01J 37/3171; H01J 2237/31701; H01J 2237/31703; H01J 37/30
USPC .......................................................... 438/14
See application file for complete search history.

(56) References Cited

U.S. PATENT DOCUMENTS

| | | | |
|---|---|---|---|
| 6,566,661 B1 | 5/2003 | Mitchell | |
| 2008/0035862 A1 | 2/2008 | Eisner et al. | |
| 2008/0067397 A1* | 3/2008 | Tsukihara et al. | ..... 250/396 ML |

FOREIGN PATENT DOCUMENTS

| | | |
|---|---|---|
| JP | 7-240388 A | 9/1995 |
| JP | 2003-086530 A | 3/2003 |

(Continued)

OTHER PUBLICATIONS

Japanese Office Action, Japanese Patent Application No. 2011-064666 dated Mar. 5, 2014.

(Continued)

*Primary Examiner* — Michelle Mandala
(74) *Attorney, Agent, or Firm* — Arent Fox LLP

(57) ABSTRACT

An ion implantation method includes reciprocally scanning an ion beam, mechanically scanning a wafer in a direction perpendicular to the ion beam scanning direction, implanting ions into the wafer, and generating an ion implantation amount distribution in a wafer surface of an isotropic concentric circle shape for correcting non-uniformity in the wafer surface in other semiconductor manufacturing processes, by controlling a beam scanning speed in the ion beam scanning direction and a wafer scanning speed in the mechanical scanning direction at the same time and independently using the respective control functions defining speed correction amounts.

6 Claims, 13 Drawing Sheets

(52) U.S. Cl.
CPC ........ *H01J 37/3007* (2013.01); *H01J 37/3023* (2013.01); *H01J 37/3171* (2013.01); *H01J 37/3172* (2013.01); *H01J 2237/30483* (2013.01)

(56) References Cited

FOREIGN PATENT DOCUMENTS

| | | |
|---|---|---|
| JP | 2005-235682 A | 9/2005 |
| JP | 2010-118235 A | 5/2010 |

OTHER PUBLICATIONS

Ninomiya, et al., "Controlled Dose-Modulated Ion Implantation on Serial Implanters," Extended Abstracts 2008 International Workshop on Junction Technology, (US), IEEE, 2008, pp. 25-28.

Ninomiya, et al., "Non-Uniform Does Mapping Controlled by Modulated Vertical and Horizontal Scans," Ion Implantation on Technology 2008, AIP Conference Proceedings, (US), American Institute of Physics, 2008, pp. 163-166.

* cited by examiner

ION IMPLANTATION METHOD AND ION IMPLANTATION APPARATUS

CROSS-REFERENCE TO RELATED APPLICATION

This application is a divisional application of U.S. patent application Ser. No. 13/426,423 filed Mar. 21, 2012, based upon and claims the benefit of priority from Japanese patent application No. 2011-06466, filed Mar. 23, 2011, the disclosure of which is incorporated herein in its entirety by reference.

BACKGROUND

1. Technical Field

The present invention relates to ion implantation, and more particularly to ion implantation amount control of an ion implantation apparatus.

2. Description of the Related Art

In semiconductor manufacturing processes, a process for introducing ions into a semiconductor wafer is performed in a standard procedure for the purpose of varying conductivity, varying a crystalline structure of the wafer, or the like. An apparatus used in this process is called an ion implantation apparatus, which has a function of generating ions using an ion source, and then forming an accelerated ion beam, and a function of irradiating the entire surface of the semiconductor wafer with the ion beam, through beam scanning, wafer scanning, or a combination thereof.

In the semiconductor manufacturing processes, in order to create semiconductor chips having the same performance across the entire surface of the wafer, typically, it is necessary to form a uniform condition in the wafer surface. In the ion implantation process, typically, the ion implantation apparatus is controlled such that an ion implantation amount implanted over the entire region of the wafer is made to be uniform.

SUMMARY

According to an embodiment of the present invention, there is provided an ion implantation method including reciprocally scanning an ion beam; mechanically scanning a wafer in a direction perpendicular to the ion beam scanning direction; implanting ions into the wafer; and generating an ion implantation amount distribution in a wafer surface of an isotropic concentric circle shape for correcting non-uniformity in the wafer surface in other semiconductor manufacturing processes, by performing speed control of a beam scanning speed in the ion beam scanning direction and a wafer scanning speed in the mechanical scanning direction at the same time and independently using the respective control functions defining speed correction amounts.

According to another embodiment of the present invention, there is provided an ion implantation apparatus which implants ions into a wafer, including a control system that reciprocally scans an ion beam and mechanically scans the wafer in a direction perpendicular to the ion beam scanning direction, wherein the control system generates an ion implantation amount distribution in a wafer surface of an isotropic concentric circle shape for correcting non-uniformity in the wafer surface in other semiconductor manufacturing processes, by performing speed control of a beam scanning speed in the ion beam scanning direction and a wafer scanning speed in the mechanical scanning direction at the same time and independently using the respective control functions defining speed correction amounts.

According to still another embodiment of the present invention, there is provided an ion implantation method including reciprocally scanning an ion beam; mechanically scanning a wafer in a direction perpendicular to the ion beam scanning direction; implanting ions into the wafer; and generating an ion implantation amount distribution in a wafer surface of an elliptical shape for correcting non-uniformity in the wafer surface in other semiconductor manufacturing processes, by performing speed control of a beam scanning speed in the ion beam scanning direction and a wafer scanning speed in the mechanical scanning direction at the same time and independently using the respective control functions defining speed correction amounts.

According to still another embodiment of the present invention, there is provided an ion implantation apparatus which implants ions into a wafer, including a control system that reciprocally scans an ion beam and mechanically scans the wafer in a direction perpendicular to the ion beam scanning direction, wherein the control system generates an ion implantation amount distribution in a wafer surface of an elliptical shape for correcting non-uniformity in the wafer surface in other semiconductor manufacturing processes, by performing speed control of a beam scanning speed in the ion beam scanning direction and a wafer scanning speed in the mechanical scanning direction at the same time and independently using the respective control functions defining speed correction amounts.

DESCRIPTION OF THE PREFERRED EMBODIMENTS

Figure 1:
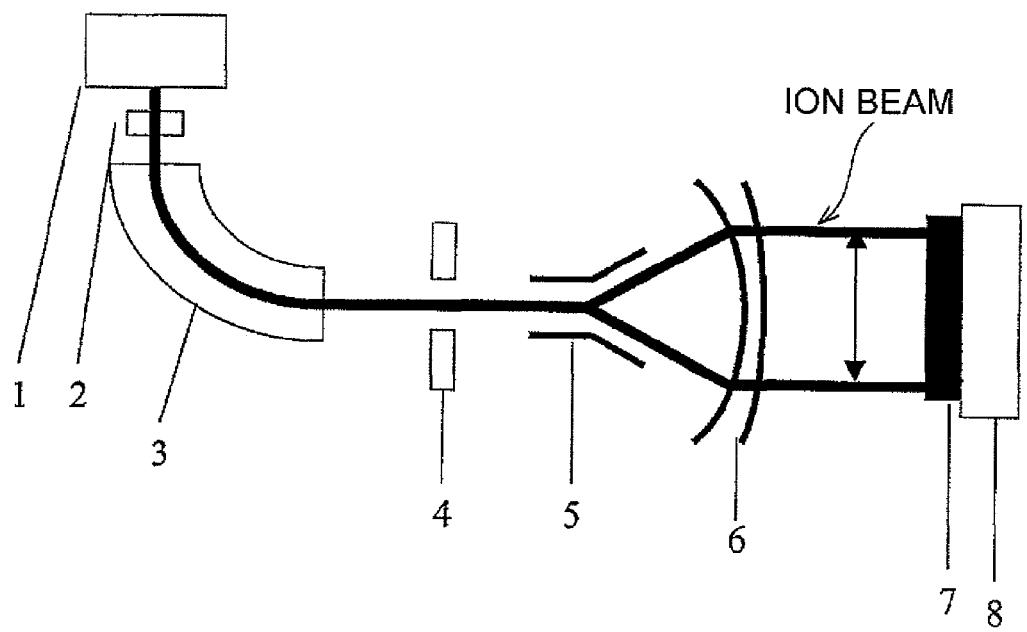
FIG. 1 is a schematic configuration diagram illustrating an example of the ion implantation apparatus according to a preferred embodiment of the present invention.

In some semiconductor manufacturing processes, it is difficult to make a uniform condition in the wafer surface in principle. Particularly, in recent years, miniaturization of the semiconductor chip has rapidly progressed, and as their difficulty therein has increased, the extent of non-uniform extent also increased. If a uniform condition is formed in the wafer surface in other processes under such conditions, as a result, semiconductor chips having the same performance in the entire wafer surface cannot be created. For example, in the ion implantation process, when a typical ion implantation is performed such that an ion implantation amount in the surface is uniform, electrical characteristics of resultant semiconductor chips are not the same as each other, and thus semiconductor chips having the same performance cannot be created.

Therefore, in a case where a uniform condition cannot be formed in the wafer surface in the other semiconductor manufacturing processes, in order to handle the two-dimensional non-uniformity in the wafer surface, a non-uniform two-dimensional ion implantation amount in-surface (or in-plane) distribution may be intentionally created in the process of irradiating the entire wafer with an ion beam using the ion implantation apparatus, and the non-uniformity in the wafer surface may be corrected in the other semiconductor manufacturing processes. At this time, it is noted that there are cases where a step rotation implantation is allowed and not allowed, due to characteristics of the semiconductor manufacturing processes. The step rotation of the wafer is disclosed in Japanese Unexamined Patent Application Publication No. 7-240388 (JP-A-7-240388).

In the case where an intentional non-uniform two-dimensional ion implantation amount in-surface distribution is created in the process of irradiating the entire wafer surface with an ion beam, and the non-uniformity in the wafer surface is corrected in the other semiconductor manufacturing processes, since there may be a case of using an ion implantation process where the step rotation implantation is not allowed, it is important to realize intentional non-uniform two-dimensional ion implantation amount in-surface distribution without using the step rotation of the wafer.

Further, needless to say, in a case where a uniform condition cannot be formed in the wafer surface in the other semiconductor manufacturing processes, the type of in-surface non-uniformity pattern that occurs in the wafer surface is also important.

Here, it is known that processes where non-uniformity in the wafer surface easily occurs are processes using plasma and annealing processes. In these processes, a non-uniform pattern in the surface has a concentric circle shape, an eccentric shape, or an elliptical shape in many cases. Therefore, in a case of realizing an intentional non-uniform two-dimensional ion implantation amount in-surface distribution without using step rotation of the wafer, it is desirable that the non-uniform pattern in a target surface is a concentric circle shape, an eccentric shape, or an elliptical shape.

Further, in relation to the non-uniformity in the wafer surface in the other semiconductor manufacturing processes, the extent of the non-uniformity is varied depending on the type of process and the conditions used in the processes. Therefore, in a case of realizing an intentional non-uniform two-dimensional ion implantation amount in-surface distribution without using step rotation of the wafer, it is necessary to be able to change the magnitude of a correction amount intensity extent with respect to the ion implantation amount correction extent.

In addition, in a case where, in the non-uniformity in the wafer surface in the other semiconductor manufacturing processes, the non-uniform pattern in the surface has an eccentric shape, the eccentric shape type non-uniformity in the wafer surface is shown due to mainly plasma spatial distribution or temperature distribution in annealing in many cases. For example, the plasma spatial distribution is defined depending on a gas inlet position for plasma creation, an introduced gas flow rate, a plasma high frequency voltage coil position, a plasma high frequency voltage coil number, conductance spatial distribution, a vacuum pump position, and the like; however, they are generally complicated, and are varied depending on apparatus states. The temperature distribution in annealing is also complicated and is varied depending on apparatus states, and thus a central position of the eccentric shape in the wafer is not constant. Therefore, in a case of realizing an intentional non-uniform two-dimensional ion implantation amount in-surface distribution without using step rotation of the wafer, it is desirable that the eccentric central position can be set in any position in the wafer.

In addition, in a case where, in the non-uniformity in the wafer surface in the other semiconductor manufacturing processes, the non-uniform pattern in the surface has an elliptical shape, the reason why the elliptical shape type non-uniformity in the wafer surface is shown is also complicated and varied by apparatus states in the same manner as the eccentric shape. Therefore, in a case of realizing an intentional non-uniform two-dimensional ion implantation amount in-surface distribution without using the step rotation of the wafer, it is also necessary to have a degree of freedom of setting in the major axis direction of the ellipse.

Here, there are several types of ion implantation apparatus. For example, in an ion implantation apparatus of a type of fixing a wafer and scanning an ion beam in a two-dimensional manner, an intentional non-uniform two-dimensional ion implantation amount in-surface distribution such as a concentric circle shape, an eccentric shape, or an elliptical shape is easily realized without using step rotation of the wafer. However, in recent years, since the wafer radius has been larger, it is very difficult to uniformly scan an ion beam in the two-dimensional surface, and thus this type of ion implantation apparatus is not used.

The present invention relates to an ion implantation apparatus which scans an ion beam, mechanically scans a wafer in a direction which is substantially perpendicular to the beam scanning direction, and injects ions into the wafer.

In an ion implantation method which scans an ion beam, mechanically scans a wafer in a direction which is substantially perpendicular to the beam scanning direction, and injects ions into the wafer, as a method of realizing an intentional non-uniform two-dimensional ion implantation amount in-surface distribution without using step rotation of the wafer, a method of superimposing regions in which ion implantation dose amounts are formed separately in the transverse direction and the longitudinal direction is disclosed in Japanese Unexamined Patent Application Publication No. 2003-86530 (JP-A-2003-86530).

Since the ion implantation dose amount distributions formed separately in the transverse direction and the longitudinal direction are superimposed in the ion implantation method disclosed in JP-A-2003-86530, the influence of the ion beam scanning direction and the wafer scanning direction is left on the ion implantation amount pattern which can be realized in the wafer surface, and thus the pattern has a rectangular shape. Therefore, the method cannot deal with the concentric circle shape, the eccentric shape, and the elliptical shape which frequently occur as a two-dimensional non-uniform pattern in the other semiconductor manufacturing processes.

It is desirable to realize a two-dimensional ion implantation amount in-surface distribution corresponding to a shape associated with a non-uniform pattern in the surface in other semiconductor manufacturing processes, for example, processes using plasma or annealing processes, in a case of performing ion implantation without using step rotation of a wafer, in an ion implantation method of scanning an ion beam, mechanically scanning the wafer in a direction substantially perpendicular to the beam scanning direction, and implanting ions into the wafer.

Certain embodiments of the present invention realize the following detailed contents.

In an image processing apparatus which scans an ion beam, mechanically scans a wafer in a direction substantially perpendicular to the beam scanning direction, and implants ions into the wafer, an intentional non-uniform two-dimensional ion implantation amount in-surface distribution of a concentric circle shape, an eccentric shape, or an elliptical shape can be realized without using step rotation of the wafer.

In the variety of shapes, the magnitude of correction amount intensity in the ion implantation surface can be changed.

In the eccentric shape, a position of the eccentric center can be set at any position in the wafer surface.

In the elliptical shape, the major axis thereof can be set in any direction of the beam scanning direction and the wafer scanning direction.

Certain embodiments of the present invention are applied to an apparatus which scans an ion beam, mechanically scans the wafer in a direction substantially perpendicular to the beam scanning direction, and implants ions into the wafer.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a sum of or a difference between a term proportional to the square of the distance and a constant term may be used as a correction amount, and a correction amount distribution where proportional constants of the terms proportional to the square of the distance in the ion beam scanning direction and the mechanical scanning direction are the same may be used.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a characteristic function created from a sum of or a difference between a term proportional to the square of the distance and a constant term may be used as the control function, and a characteristic function where proportional constants of the terms proportional to the square of the distance in the ion beam scanning direction and the mechanical scanning direction are the same may be used.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a sum of or a difference between a term of a cosine function value of a term proportional to the variable and a constant term may be used as a correction amount, and a correction amount distribution where proportional constants of the terms proportional to the distance from the wafer center in the ion beam scanning direction and the mechanical scanning direction are the same may be used.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a characteristic function created from a sum of or a difference between a term of a cosine function value of a term proportional to the variable and a constant term may be used as the control function, and a characteristic function where proportional constants of the terms proportional to the distance from the wafer center in the ion beam scanning direction and the mechanical scanning direction are the same may be used.

In the ion implantation method according to the embodiment of the present invention, as a modified example thereof, when the speed control is performed, an arbitrary point may be set in the wafer surface, the point is regarded as a rotation center, and the ion implantation amount distribution in the wafer surface of the isotropic concentric circle shape may be generated with respect to the rotation center.

In the ion implantation method according to the modified example of the present invention, in relation to a beam scanning speed correction amount in the ion beam scanning direction and a wafer scanning speed correction amount in the mechanical scanning direction, a distance from an arbitrary point set in the wafer surface may be used as a variable, a sum of or a difference between a term proportional to the square of the distance and a constant term may be used as a correction amount, and a correction amount distribution where proportional constants of the terms proportional to the square of the distance in the ion beam scanning direction and the mechanical scanning direction are the same may be used.

In the ion implantation method according to the modified example of the present invention, in relation to a beam scanning speed correction amount in the ion beam scanning direction and a wafer scanning speed correction amount in the mechanical scanning direction, a distance from an arbitrary point set in the wafer surface may be used as a variable, a characteristic function created from a sum of or a difference between a term proportional to the square of the distance and a constant term may be used as the control function, and a characteristic function where proportional constants of the terms proportional to the square of the distance in the ion beam scanning direction and the mechanical scanning direction are the same may be used.

In the ion implantation method according to the modified example of the present invention, in relation to a beam scanning speed correction amount in the ion beam scanning direction and a wafer scanning speed correction amount in the mechanical scanning direction, a distance from an arbitrary point set in the wafer surface may be used as a variable, a sum of or a difference between a term of a cosine function value of a term proportional to the variable and a constant term may be used as a correction amount, and a correction amount distribution where proportional constants of the terms proportional to the distance from the arbitrary point in the wafer surface in the ion beam scanning direction and the mechanical scanning direction are the same may be used.

In the ion implantation method according to the modified example of the present invention, in relation to a beam scanning speed correction amount in the ion beam scanning direction and a wafer scanning speed correction amount in the mechanical scanning direction, a distance from an arbitrary point set in the wafer surface may be used as a variable, a characteristic function created from a sum of or a difference between a term of a cosine function value of a term proportional to the variable and a constant term may be used as a control function, and a characteristic function where proportional constants of the terms proportional to the distance from the arbitrary point in the wafer surface in the ion beam scanning direction and the mechanical scanning direction are the same may be used.

In the ion implantation apparatus according to the embodiment of the present invention, the control system may set an arbitrary point in the wafer surface, regard the point as a rotation center, and generate the ion implantation amount distribution in the wafer surface of the isotropic concentric circle shape with respect to the rotation center.

In the ion implantation method according to the embodiment of the present invention, as a modified example, when the speed control is performed, in relation to a beam scanning speed correction amount in the ion beam scanning direction and a wafer scanning speed correction amount in the mechanical scanning direction, a distance from a wafer center is used as a variable, a sum of or a difference between a term proportional to the square of the distance and a constant term may be used as a correction amount, and a correction amount distribution where proportional constants of the terms proportional to the square of the distance in the ion beam scanning direction and the mechanical scanning direction are different may be used.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a characteristic function created from a sum of or a difference between a term proportional to the square of the distance and a constant term is used as the control function, and a characteristic function where proportional constants of the terms proportional to the square of the distance in the ion beam scanning direction and the mechanical scanning direction are different may be used.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a sum of or a difference between a term of a cosine function value of a term proportional to the variable and a constant term may be used as a correction amount, and a correction amount distribution where proportional constants of the terms proportional to the distance from the wafer center in the ion beam scanning direction and the mechanical scanning direction are different may be used.

In the ion implantation method according to the embodiment of the present invention, when the speed control is performed, in relation to a beam scanning speed correction amount in the ion beam scanning direction and a wafer scanning speed correction amount in the mechanical scanning direction, a distance from a wafer center may be used as a variable, a characteristic function created from a sum of or a difference between a term of a cosine function value of a term proportional to the variable and a constant term may be used as the control function, and a characteristic function where proportional constants of the terms proportional to the distance from the wafer center in the ion beam scanning direction and the mechanical scanning direction are different may be used.

Here, a schematic configuration of the ion implantation apparatus according to a preferred embodiment (first preferred embodiment) of the present invention will be described with reference to FIG. 1. In the ion implantation apparatus according to the preferred embodiment of the present invention, a mass spectrometry magnet device 3, a mass spectrometry slit 4, a beam scanner 5, and a wafer treatment chamber (ion implantation chamber) are disposed along a beam line such that an ion beam extracted from an ion source 1 by an extraction electrode 2 pass through the beam line reaching to a wafer 7. In the wafer treatment chamber, a mechanical scanning device including a holder 8 holding the wafer 7 is disposed. The ion beam extracted from the ion source 1 are guided to the wafer 7 on the holder 8 disposed at an ion implantation position of the wafer treatment chamber along the beam line.

The ion beam becomes parallel to the ion beam travelling direction before entering into the beam scanner 5, by a function of a parallel lens 6 after being reciprocally scanned by the beam scanner 5, and then are guided to the wafer 7.

In the ion implantation apparatus according to the preferred embodiment of the present invention, the wafer is mechanically scanned in a direction which is substantially perpendicular to the ion beam scanning direction, and thereby ions are injected into the wafer 7. In FIG. 1, the wafer 7 may be scanned in the perpendicular direction to the figure.

Figure 2:
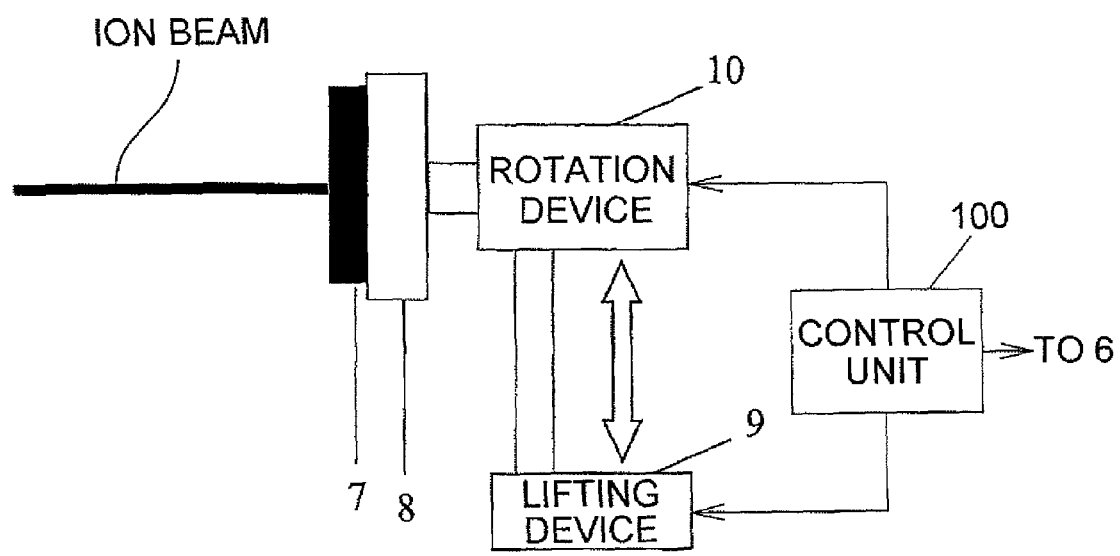
FIG. 2 is an enlarged schematic diagram illustrating an example of the wafer periphery of the ion implantation apparatus shown in FIG. 1 seen from the side surface direction.

FIG. 2 is a schematic diagram illustrating an example of the wafer periphery of the ion implantation apparatus shown in FIG. 1 through enlargement. In FIG. 2, the ion beam is scanned in the perpendicular direction to the figure and is applied to the wafer 7 held on the holder 8. The holder 8 is reciprocally driven in the arrow direction in the figure by a lifting device 9, and, as a result, the wafer 7 held on the holder 8 is also reciprocally driven in the arrow direction in the figure. In other words, the ion beam is reciprocally scanned, and the wafer 7 is mechanically scanned in the direction substantially perpendicular to the beam scanning direction, thereby injecting ions into the entire surface of the wafer 7. Although not used in the preferred embodiment of the present invention, for better understanding through comparison with the related art described later, a rotation device 10 used for step rotation implantation of the wafer is also shown.

Figure 3:
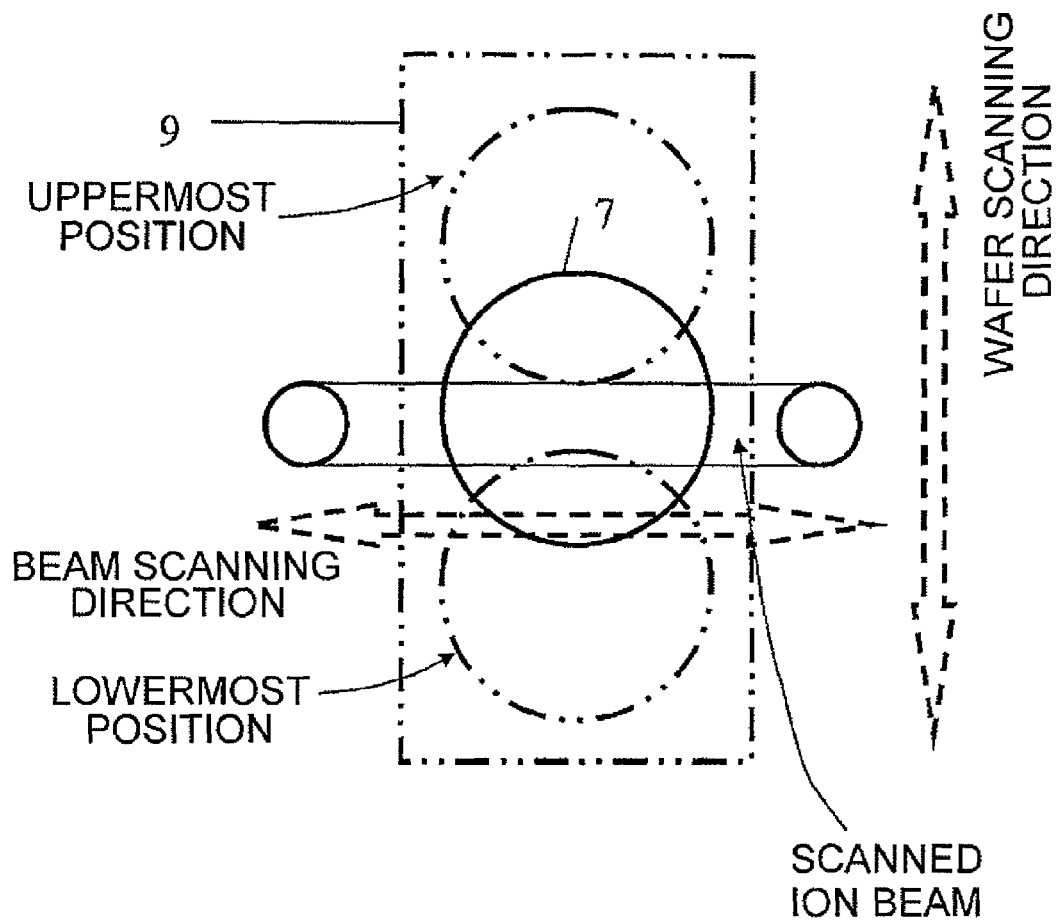
FIG. 3 is a diagram illustrating an ion beam scanning function and a wafer scanning function.

Here, an ion beam scanning function and a wafer scanning function will be described with reference to FIG. 3. In FIG. 3, only the scanned wafer 7, the scanned ion beam, and the lifting device 9 are shown, and the holder and the rotation device are not shown. In this example, the ion beam is scanned in the transverse direction, and the wafer 7 is scanned in the longitudinal direction so as to reciprocate between the uppermost position and the lowermost position. As shown in FIG. 3, a control is performed such that the scanning region of the ion beam exceeds the diameter of the wafer 7, and a region where the wafer 7 is mechanically scanned cuts across the ion beam.

The ion beam scanning function of the beam scanner 5 and the wafer scanning function of the lifting device 9 are realized by a control unit 100 for controlling the above-described elements. The beam scanner 5, the lifting device 9, and the control unit 100 having a function of controlling at least the above-described elements may be collectively referred to as a control system.

The ion implantation apparatus according to the preferred embodiment of the present invention is a device which reciprocally scans the ion beam, mechanically scans the wafer in the direction substantially perpendicular to the beam scanning direction, and injects ions into the wafer, but if an ion implantation amount implanted into the wafer is to be considered, a relative movement between the ion beam and the wafer is problematic. Therefore, for convenience of understanding, assuming that the wafer stops, an implantation region of the ion beam and a beam scanning speed may be considered relatively.

Figure 4:
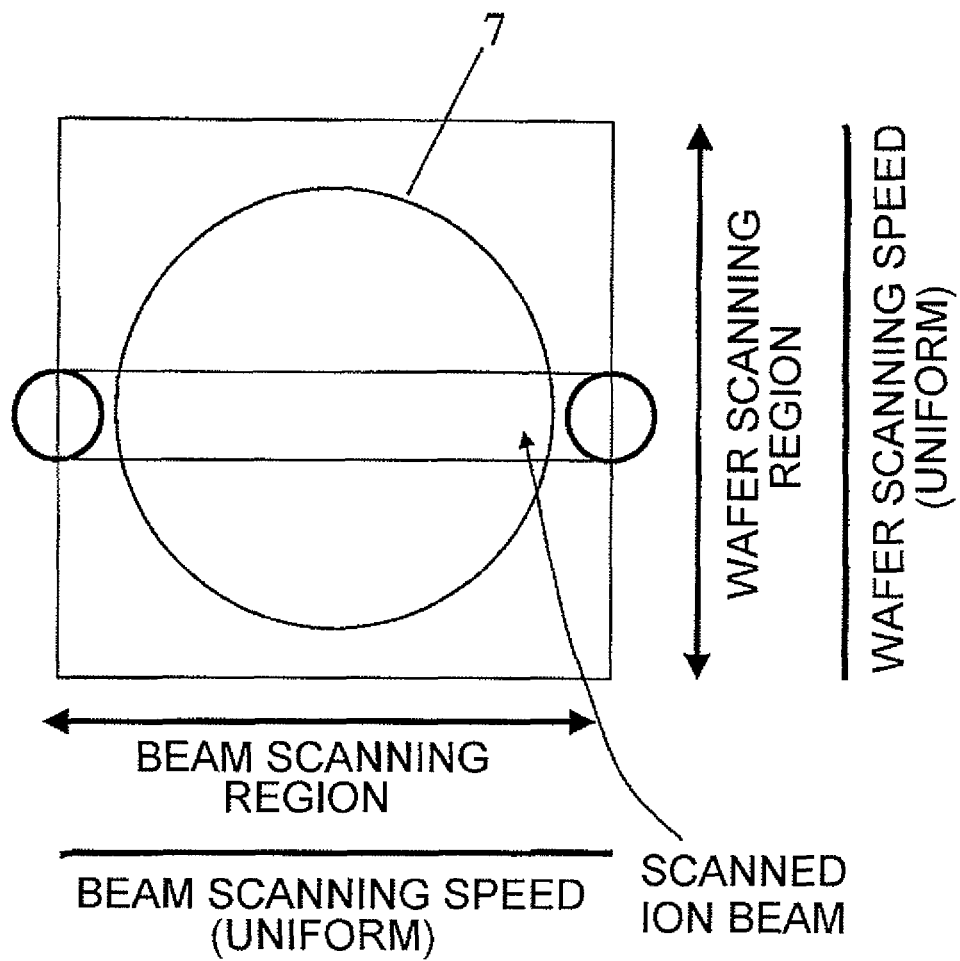
FIG. 4 is a diagram illustrating uniform implantation into the wafer surface which is performed in the related art.

FIG. 4 is a diagram illustrating uniform implantation in the wafer surface which is performed in the related art. In a standard uniform implantation into the wafer surface in the related art, in order to secure ion implantation amount uniformity in the transverse direction on the wafer, a scanning speed of the ion beam is maintained to be nearly constant. In addition, in order to maintain ion implantation amount uniformity in the longitudinal direction on the wafer, a mechanical scanning speed is maintained to be nearly constant.

Here, in the device which reciprocally scans the ion beam, mechanically scans the wafer in the direction substantially perpendicular to the beam scanning direction, and injects ions into the wafer, a description will be made of a method of creating an intentional non-uniform two-dimensional ion implantation amount in-surface distribution in the wafer surface.

Typically, a method is known where one of a beam scanning speed in the ion beam scanning direction and a wafer scanning speed in the mechanical scanning direction is controlled, and the rotation device 10 shown in FIG. 2 is used, thereby creating an intentional non-uniform two-dimensional ion implantation amount in-surface distribution in the wafer surface through step rotation implantation. In this case, even if a beam scanning speed control or a wafer scanning speed control is linearly or quadratically performed, the step rotation implantation has rotation symmetry, and thus it is possible to realize a non-uniform two-dimensional ion implantation amount in-surface distribution of a concentric circle shape.

However, since there are cases where step rotation implantation is not allowed due to the characteristics of the semiconductor manufacturing processes in the ion implantation process, this method cannot be employed in the ion implantation procedure in which the ion implantation process is not allowed, and thus an intentional non-uniform two-dimensional ion implantation amount in-surface distribution cannot be created in the wafer surface.

In addition, since use of this step rotation implantation necessarily causes rotation symmetry, an intentional non-uniform two-dimensional ion implantation amount in-surface distribution of an eccentric shape or an elliptical shape cannot be created.

Here, in the ion implantation method of reciprocally scanning the ion beam, mechanically scanning the wafer in the direction substantially perpendicular to the beam scanning direction, and injecting ions into the wafer, as a method of creating an intentional non-uniform two-dimensional ion implantation amount in-surface distribution without using step rotation implantation, there is a method of superimposing ion implantation dose amount distributions separately in the transverse direction and the longitudinal direction by controlling a beam scanning speed in the ion beam scanning direction and a wafer scanning speed in the mechanical scanning direction.

Here, the method of superimposing ion implantation dose amount distributions formed separately in the transverse direction and the longitudinal direction by controlling a beam scanning speed in the ion beam scanning direction and a wafer scanning speed in the mechanical scanning direction, will be described in more detail with reference to FIG. 12.

Figure 12:
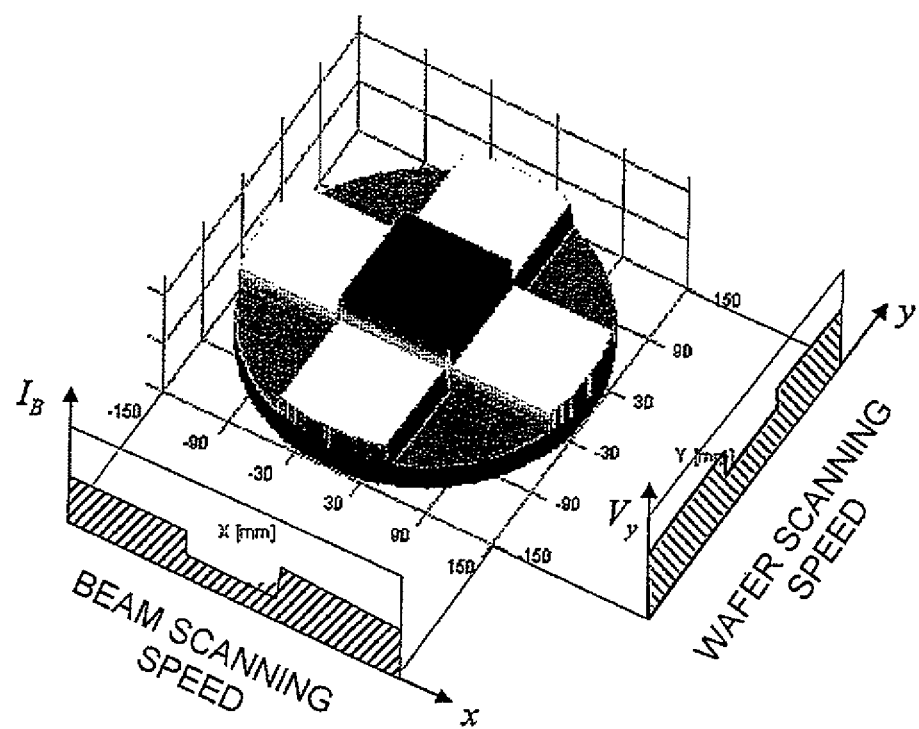
FIG. 12 is a diagram illustrating non-uniform implantation into the wafer surface which is performed in the related art.

As in FIG. 12, if ion implantation dose amount distributions formed separately in the transverse direction and the longitudinal direction are superimposed, it is possible to reliably realize a non-uniform two-dimensional ion implantation amount in-surface distribution in the wafer surface. However, influence of the ion beam scanning direction and the wafer scanning direction is left on the ion implantation amount pattern which can be realized in the wafer surface, and thus the pattern has a rectangular shape. Therefore, the method cannot deal with the concentric circle shape, the eccentric shape, and the elliptical shape which frequently occur as a two-dimensional non-uniform pattern in the other semiconductor manufacturing processes.

Further, even in a case where implantation is performed by correlating a beam scanning speed correction amount in the ion beam scanning direction and a wafer scanning speed correction amount in the mechanical scanning direction with each other, if the correlation is not clearly defined, an intentional non-uniform two-dimensional ion implantation amount in-surface distribution, particularly, a non-uniform two-dimensional ion implantation amount in-surface distribution of the concentric circle shape, the eccentric shape, and the elliptical shape which frequently occur as a two-dimensional non-uniform pattern in the other semiconductor manufacturing processes, cannot be realized as desired.

According to the preferred embodiment of the present invention, in the device which reciprocally scans the ion beam, mechanically scans the wafer in the direction substantially perpendicular to the beam scanning direction, and injects ions into the wafer, in a case of creating an intentional non-uniform two-dimensional ion implantation amount in-surface distribution without using step rotation implantation, a beam scanning speed correction amount in the ion beam scanning direction and a wafer scanning speed correction amount in the mechanical scanning direction are correlated with each other using a predefined method, an intentional non-uniform two-dimensional ion implantation amount in-surface distribution of the concentric circle shape, the eccentric shape, and the elliptical shape is created in the wafer surface, thereby handling the concentric circle shape, the eccentric shape, and the elliptical shape which frequently occur as a two-dimensional non-uniform pattern in other semiconductor manufacturing processes.

Figure 13:
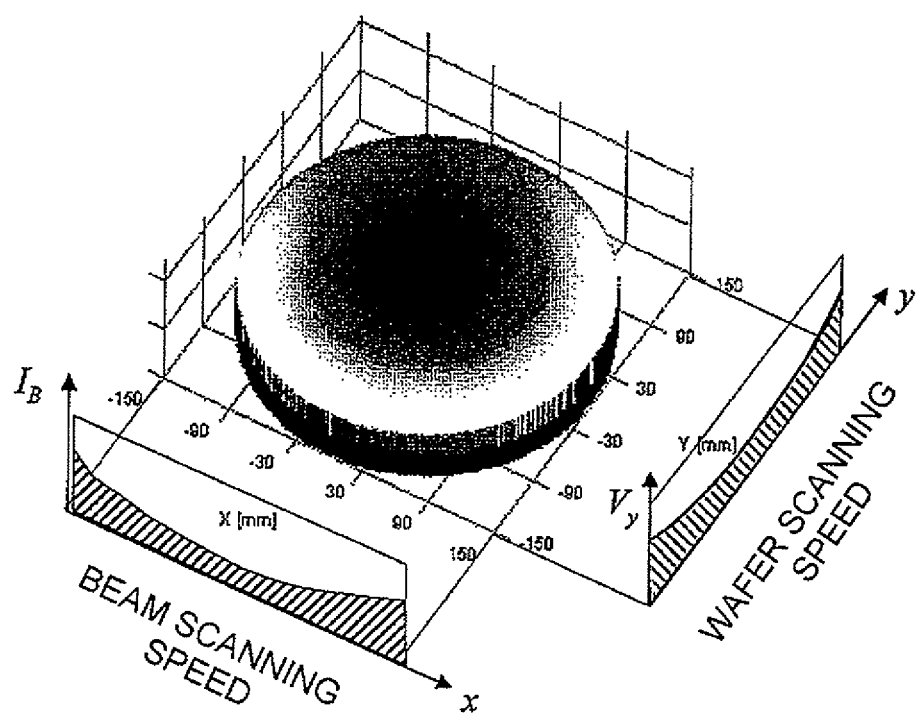
FIG. 13 is a diagram illustrating non-uniform implantation into the wafer surface according to a preferred embodiment of the present invention.

Here, a conceptual description will be made of a method of realizing an intentional non-uniform two-dimensional ion implantation amount in-surface distribution of the concentric circle shape, the eccentric shape, and the elliptical shape in the wafer surface, by correlating a beam scanning speed correction amount in the ion beam scanning direction and a wafer scanning speed correction amount in the mechanical scanning direction with each other using a predefined method, used in the preferred embodiment of the present invention, with reference to FIG. 13. FIG. 13 exemplifies a method of realizing an intentional non-uniform two-dimensional ion implantation amount in-surface distribution of the concentric circle shape as the conceptual description, and this is also conceptually the same for an intentional non-uniform two-dimensional ion implantation amount in-surface distribution of the eccentric shape or the elliptical shape.

As described in FIG. 12, in a case of superimposing ion implantation dose amount distributions formed separately in the transverse direction and the longitudinal direction, and in a case of performing implantation by correlating a beam scanning speed in the ion beam scanning direction and a wafer scanning speed in the mechanical scanning direction, if the correlation is not clearly defined, influence of the ion beam scanning direction and the wafer scanning direction is left on the ion implantation amount pattern which can be realized in the wafer surface, and thus the pattern has a rectangular shape. The influence of the rectangular shape is excluded only in a case where a beam scanning speed correction amount in the ion beam scanning direction and a wafer scanning speed correction amount in the mechanical scanning direction are correlated with each other using a predefined method, an intentional non-uniform two-dimensional ion implantation amount in-surface distribution is created, it is possible to realize an intentional non-uniform two-dimensional ion implantation amount in-surface distribution of a continuous and smooth curved shape as shown in FIG. 13 in the wafer surface. Particularly, as conceptually shown in FIG. 13, it is possible to realize an intentional non-uniform two-dimensional ion implantation amount in-surface distribution of the concentric circle shape, which is not influenced by the ion beam scanning direction and the wafer scanning direction.

Here, first, the ion implantation method where a beam scanning speed correction amount in the ion beam scanning direction and a wafer scanning speed correction amount in the mechanical scanning direction are correlated with each other, and an intentional non-uniform two-dimensional ion implantation amount in-surface distribution 11 of the concentric circle shape is created in the wafer surface, will be described in detail with reference to FIG. 5. As described in FIG. 4, if an ion implantation amount implanted into the wafer 7 is to be considered, for convenience of understanding, assuming that the wafer stops, an implantation region of the ion beam and a beam scanning speed may be considered relatively. Therefore, in FIG. 5 as well, for convenience of understanding, the wafer 7 is shown as if it is stopped.

In the preferred embodiment of the present invention, in relation to a beam scanning speed correction amount in the ion beam scanning direction and a wafer scanning speed correction amount in the mechanical scanning direction, by using a predefined method where a distance from the wafer center is used as a variable, a sum of or a difference (hereinafter, referred to as a "quadratic function type") between a term proportional to the square of the distance and a constant term is used as a correction amount, and a correction amount distribution where proportional constants of the terms proportional to the square of the distance in the ion beam scanning direction and the mechanical scanning direction are the same is used, the beam scanning speed correction amount and the wafer scanning speed correction amount are correlated with each other, and thereby an intentional non-uniform two-dimensional ion implantation amount in-surface distribution 11 of the concentric circle shape is created in the wafer surface.

Figure 5:
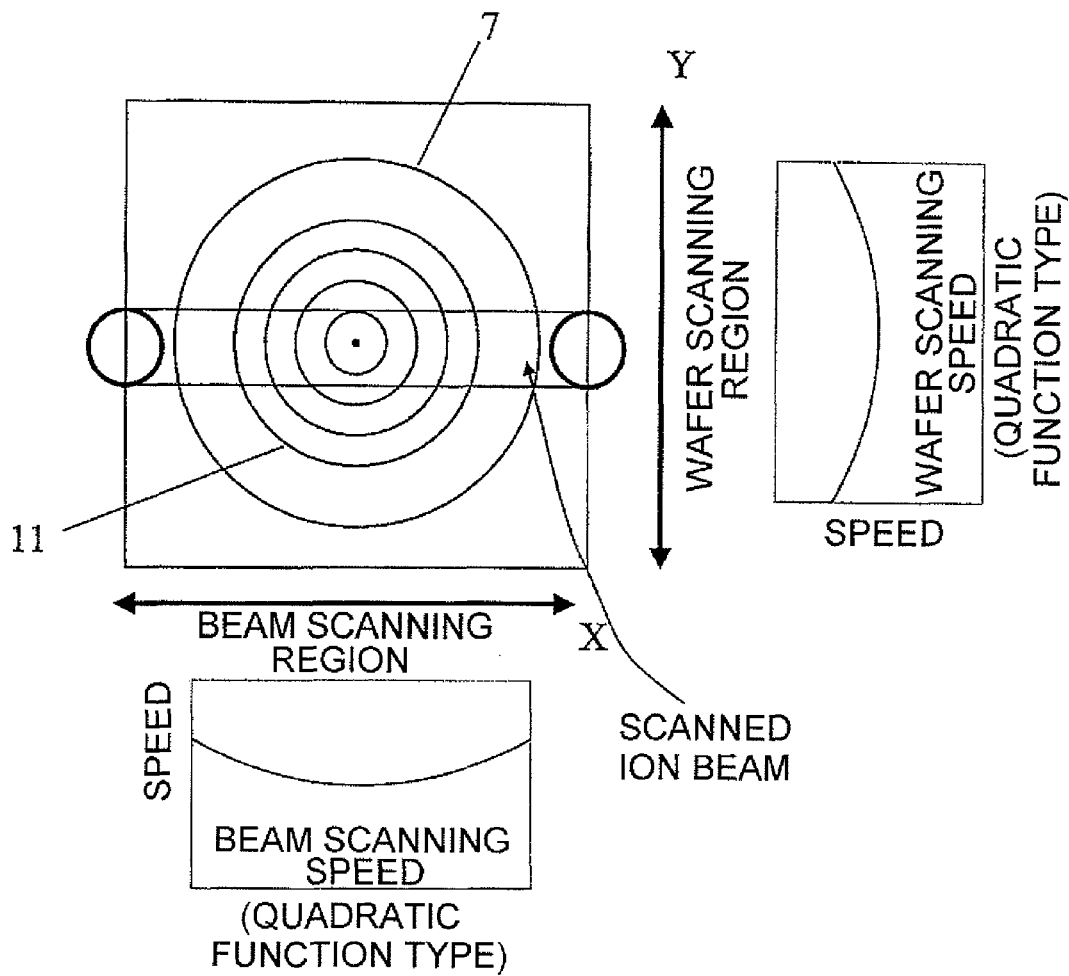
FIG. 5 is a diagram illustrating a first example of the ion implantation method of intentionally forming a non-uniform two-dimensional ion implantation amount in-surface distribution of a concentric circle shape in the wafer surface according to a preferred embodiment of the present invention.

As described in FIG. 13, the intentional non-uniform two-dimensional ion implantation amount in-surface distribution 11 of the concentric circle shape shown in FIG. 5 is a continuous and smooth ion implantation amount in-surface distribution. FIG. 5 schematically shows a contour distribution thereof, and does not show that the distribution is divided into the inside and the outside with reference to the boundary line.

Figure 6:
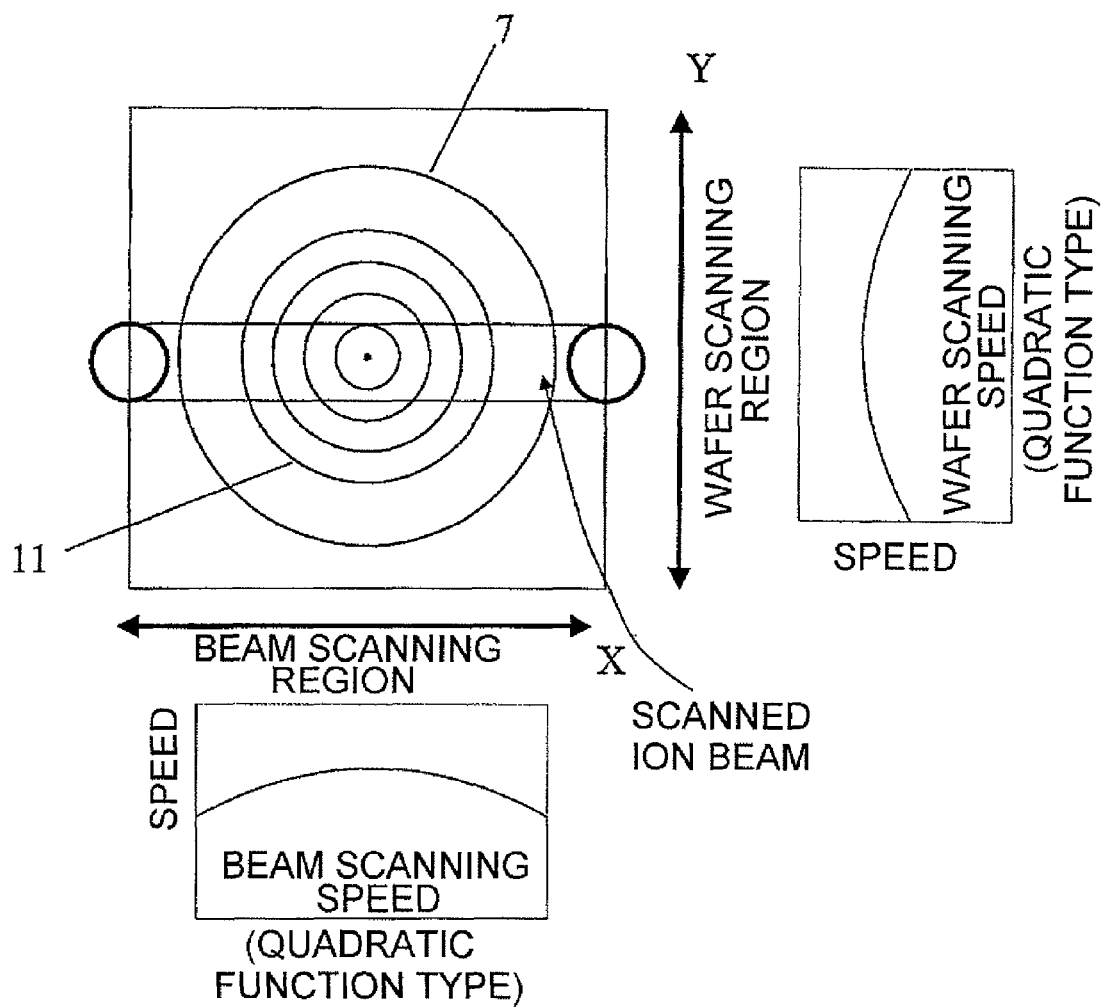
FIG. 6 is a diagram illustrating a second example of the ion implantation method of intentionally forming a non-uniform two-dimensional ion implantation amount in-surface distribution of a concentric circle shape in the wafer surface according to a preferred embodiment of the present invention.

In addition, the quadratic function type beam scanning speed correction amount and wafer scanning speed correction amount may have a small correction amount at the wafer center as shown in FIG. 5, or may have a large correction amount at the wafer center as shown in FIG. 6. In addition, in FIG. 5, in the beam scanning speed and the wafer scanning speed shown so as to respectively correspond to the beam scanning region and the wafer scanning region, the curves indicating such correction amount distributions have the transverse axis expressing the scanning region and the longitudinal axis expressing the scanning speed. This is also the same for FIGS. 6 to 11 described later.

In the ion implantation method according to the preferred embodiment of the present invention, a description will be made of the reason why, in relation to a beam scanning speed correction amount in the ion beam scanning direction and a wafer scanning speed correction amount in the mechanical scanning direction, by using the distance from the wafer center as a variable, using the quadratic function type correction amount, and using the ion implantation distribution where proportional constants of terms proportional to the square of the distance in the ion beam scanning direction and the mechanical scanning direction are the same, an intentional non-uniform two-dimensional ion implantation amount in-surface distribution 11 of the concentric circle shape is created in the wafer surface. Here, although the description is made using a planar coordinate in the ion beam scanning direction as an X coordinate, and a planar coordinate in the mechanical scanning direction as a Y coordinate, a method of taking coordinates in the plane is not limited thereto, and even if a planar coordinate in the ion beam scanning direction is used as a Y coordinate, and a planar coordinate in the mechanical scanning direction is used as an X coordinate, a result is the same.

Since the ion implantation apparatus according to the preferred embodiment of the present invention controls a beam scanning speed correction amount in the ion beam scanning direction and a wafer scanning speed correction amount in the mechanical scanning direction at the same time and independently, the ion implantation amount in-surface distribution $D(x,y)$ in the coordinates $(x,y)$ in the wafer surface is expressed by a product $I(x) \times J(y)$ of the beam scanning speed correction amount and the wafer scanning speed correction amount using the beam scanning speed correction amount $I(x)$ and the wafer scanning speed correction amount $J(y)$, and it is possible to derive a control function (or characteristic function) described later by using the product. In this case, generally, the ion implantation amount in-surface distribution $D(x,y)$ is not a function of a distance from the wafer center, and thus is not directly correlated with the distance from the wafer center.

In the method of superimposing ion implantation dose amount distributions formed separately in the transverse direction and the longitudinal direction by controlling a beam scanning speed correction amount in the ion beam scanning direction and a wafer scanning speed correction amount in the mechanical scanning direction, the respective correction amounts are not correlated with each other. For this reason, the ion implantation amount in-surface distribution D(x,y) can be correlated only with the wafer X coordinate and the wafer Y coordinate as generally described above and is not correlated with the distance from the wafer center. Thereby, influence of the ion beam scanning direction and the wafer scanning direction is left on the ion implantation amount pattern which can be realized in the wafer surface, and thus the pattern has a rectangular shape.

As a result, an intentional non-uniform two-dimensional ion implantation amount in-surface distribution of the concentric circle shape cannot be created in the wafer surface.

In order to create an intentional non-uniform two-dimensional ion implantation amount in-surface distribution of the concentric circle shape in the wafer surface, when the distance from the wafer center is denoted by r, the ion implantation amount in-surface distribution D(x,y) is required to be directly correlated with the distance r from the wafer center as a function of the distance r from the wafer center.

In the ion implantation method according to the preferred embodiment of the present invention, by using a quadratic function type correction amount and the correction amount distribution where proportional constants of terms proportional to the square of the distance in the ion beam scanning direction and the mechanical scanning direction are the same, in relation to the beam scanning speed correction amount in the ion beam scanning direction and the wafer scanning speed correction amount in the mechanical scanning direction, the beam scanning speed correction amount I(x) and the wafer scanning speed correction amount J(y) are given the following correction amounts so as to be correlated with each other. That is to say, $I(x)=A\pm Bx^2$, and $J(y)=A\pm By^2$. Here, A and B are constants.

As such, in a case of using a quadratic function type correction amount and the correction amount distribution where proportional constants of terms proportional to the square of the distance in the ion beam scanning direction and the mechanical scanning direction are the same, in relation to the beam scanning speed correction amount in the ion beam scanning direction and the wafer scanning speed correction amount in the mechanical scanning direction, the ion implantation amount in-surface distribution D(x,y) in the coordinates (x,y) in the wafer surface is expressed by $D(x,y)=(A\pm Bx^2)\times(A\pm By^2)$. When this equation is expanded, and the minute terms are disregarded, the equation can be transformed into $D(x,y)=A\times\{A\pm B(x^2+y^2)\}$. Here, the distance r from the wafer center has a relationship of $r^2=x^2+y^2$ with the wafer X coordinate and the wafer Y coordinate, and the ion implantation amount in-surface distribution D(x,y) in the coordinates (x,y) in the wafer surface can be transformed into $D(r)=A\times\{A\pm B(r^2)\}$.

As such, in a case of using a quadratic function type correction amount and correction amount distribution where proportional constants of terms proportional to the square of the distance in the ion beam scanning direction and the mechanical scanning direction are the same, in relation to the beam scanning speed correction amount in the ion beam scanning direction and the wafer scanning speed correction amount in the mechanical scanning direction, the ion implantation amount in-surface distribution mathematically becomes a function of the distance r from the wafer center as D(r) and thus can be directly correlated with the distance r from the wafer center. Therefore, it is possible to create an intentional non-uniform two-dimensional ion implantation amount in-surface distribution of the concentric circle shape in the wafer surface.

Here, another ion implantation method where a beam scanning speed correction amount in the ion beam scanning direction and a wafer scanning speed correction amount in the mechanical scanning direction are correlated with each other, and an intentional non-uniform two-dimensional ion implantation amount in-surface distribution 11 of the concentric circle shape is created in the wafer surface, will be described in detail with reference to FIG. 7. In the embodiment of the present invention, in relation to a beam scanning speed correction amount in the ion beam scanning direction and a wafer scanning speed correction amount in the mechanical scanning direction, by using a predefined method where a distance from the wafer center is used as a variable, a sum of or a difference (hereinafter, referred to as a "cosine type") between a term of a cosine function value of a term proportional to the variable and a constant term is used as a correction amount, a correction amount distribution where proportional constants of terms proportional to the distance in the ion beam scanning direction and the mechanical scanning direction are the same is used, the beam scanning speed correction amount and the wafer scanning speed correction amount are correlated with each other, and thereby an intentional non-uniform two-dimensional ion implantation amount in-surface distribution 11 of the concentric circle shape is created in the wafer surface.

Figure 7:
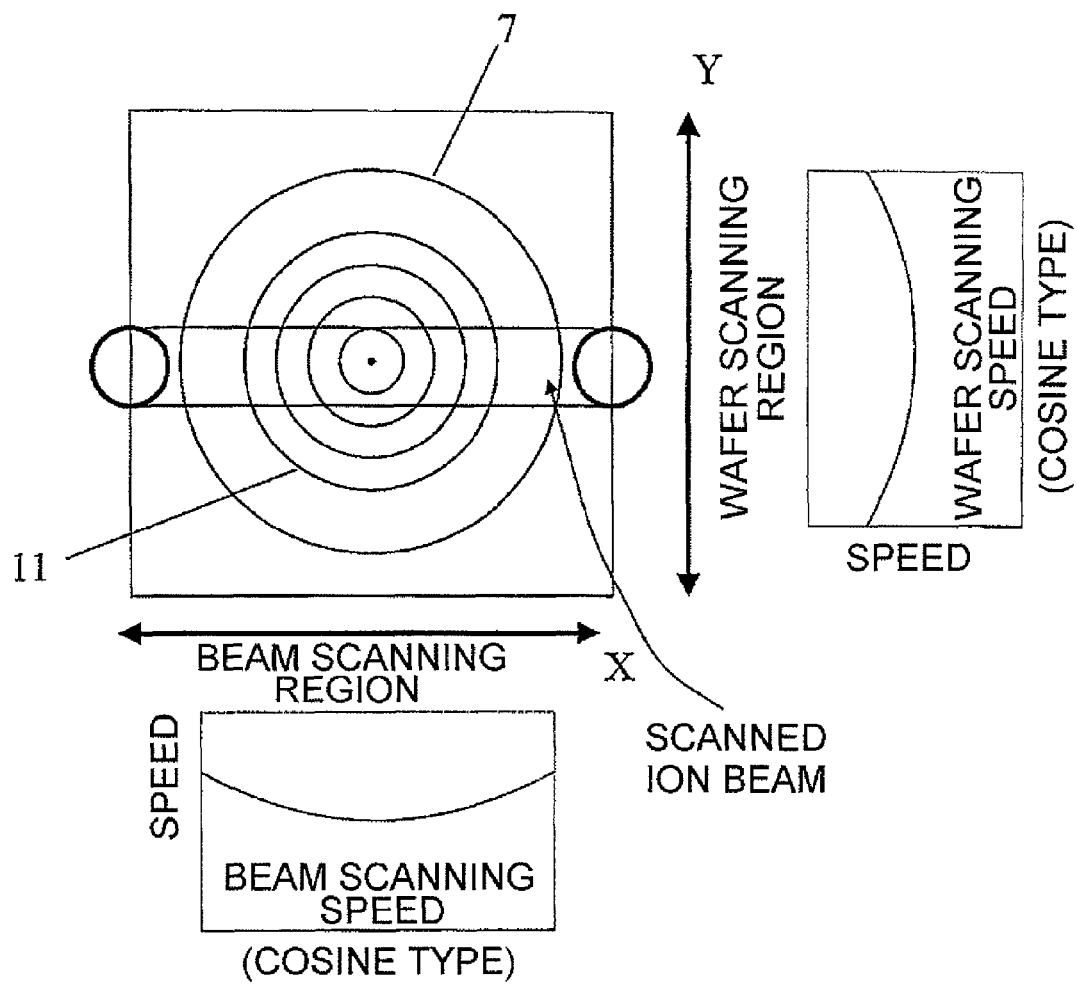
FIG. 7 is a diagram illustrating a third example of the ion implantation method of intentionally forming a non-uniform two-dimensional ion implantation amount in-surface distribution of a concentric circle shape in the wafer surface according to a preferred embodiment of the present invention.

As described in FIG. 13, the intentional non-uniform two-dimensional ion implantation amount in-surface distribution 11 of the concentric circle shape shown in FIG. 7 is a continuous and smooth ion implantation amount in-surface distribution. FIG. 7 schematically shows a contour distribution thereof, and does not show that the distribution is divided into the inside and the outside with reference to the boundary line. In addition, the cosine type beam scanning speed correction amount and wafer scanning speed correction amount may have a small correction amount at the wafer center as shown in FIG. 7, or conversely may have a large correction amount at the wafer center.

In the ion implantation method according to the preferred embodiment of the present invention, a description will be described made of the reason why, in relation to a beam scanning speed correction amount in the ion beam scanning direction and a wafer scanning speed correction amount in the mechanical scanning direction, by using the distance from the wafer center as a variable, using the cosine type correction amount, and using the ion implantation distribution where proportional constants of terms proportional to the distance in the ion beam scanning direction and the mechanical scanning direction are the same, the intentional non-uniform two-dimensional ion implantation amount in-surface distribution 11 of the concentric circle shape is created in the wafer surface. Here, the Taylor expansion can be performed for the cosine function mathematically. There are an infinite number of terms in the Taylor expansion, but the principal terms are the expanded first term and second term, and the other terms can be disregarded as minute terms. In this case, the cosine function $\cos(ax)=1-(ax)^2/2$ may be a control function (or a characteristic function).

Therefore, in the ion implantation method according to the preferred embodiment of the present invention, in relation to a beam scanning speed correction amount in the ion beam scanning direction and a wafer scanning speed correction amount in the mechanical scanning direction, using the distance from the wafer center as a variable, using the cosine type correction amount, and using the ion implantation distribution where proportional constants of terms proportional to the distance in the ion beam scanning direction and the mechanical scanning direction are the same, correspond to using a correction amount distribution similar to the above-described quadratic function type correction amount for the beam scanning speed correction amount I(x) and the wafer scanning speed correction amount J(y) so as to be correlated with each other, and, as a result, it is possible to create an intentional non-uniform two-dimensional ion implantation amount in-surface distribution of the concentric circle shape in the wafer surface in the same manner as discussed above.

In a case of using types of correction amounts other than the correction amount shown in the preferred embodiment of the present invention, influence of the ion beam scanning direction and the wafer scanning direction is left on the ion implantation amount pattern which can be realized in the wafer surface, and thereby a rectangular shape necessarily has influence thereon. Therefore, an intentional non-uniform two-dimensional ion implantation amount in-surface distribution of the concentric circle shape cannot be created in the wafer surface.

In the ion implantation method according to the preferred embodiment of the present invention, by changing a proportional constant of the term proportional to the square of the distance and the constant term in a case of using the quadratic function type correction amount, and by changing a proportional constant of the term proportional to the distance from the wafer center in a case of using the cosine type correction amount, it is possible to change correction amount intensity in the ion implantation surface in a non-uniform two-dimensional ion implantation amount in-surface distribution of the concentric circle shape which is intentionally created in the wafer surface.

As above, according to the preferred embodiment of the present invention, in the apparatus which scans an ion beam, mechanically scans a wafer in a direction which is substantially perpendicular to the beam scanning direction, and injects ions into the wafer, in a case where, in order to correct non-uniformity in the wafer surface in the other semiconductor manufacturing processes, a beam scanning speed in the ion beam scanning direction and a wafer scanning speed in the mechanical scanning direction are controlled at the same time and independently, and ion implantation is performed without using step rotation implantation of the wafer, it is possible to realize an ion implantation amount distribution of an isotropic concentric circle shape without angular direction dependency of the ion implantation amount in the wafer surface.

Next, an ion implantation method where a beam scanning speed correction amount in the ion beam scanning direction and a wafer scanning speed correction amount in the mechanical scanning direction are correlated with each other, and an intentional non-uniform two-dimensional ion implantation amount in-surface distribution 12 of the eccentric shape is created in the wafer surface, will be described with reference to FIG. 8. As described in FIG. 4, if an ion implantation amount implanted into the wafer 7 is to be considered, for convenience of understanding, assuming that the wafer stops, an implantation region of the ion beam and a beam scanning speed may be considered relatively. Therefore, in FIG. 8 as well, for convenience of understanding, the wafer 7 is shown as if it stops.

In the preferred embodiment (second preferred embodiment) of the present invention, by using a predefined method where an arbitrary point is set in the wafer surface, a quadratic function type correction amount is defined using a distance from the set arbitrary point in the wafer surface as a variable, and a correction amount distribution where proportional constants of terms proportional to the square of the distance in the ion beam scanning direction and the mechanical scanning direction are the same, the beam scanning speed correction amount and the wafer scanning speed correction amount are correlated with each other, and thereby an intentional non-uniform two-dimensional ion implantation amount in-surface distribution 12 of the eccentric shape is created in the wafer surface.

Figure 8:
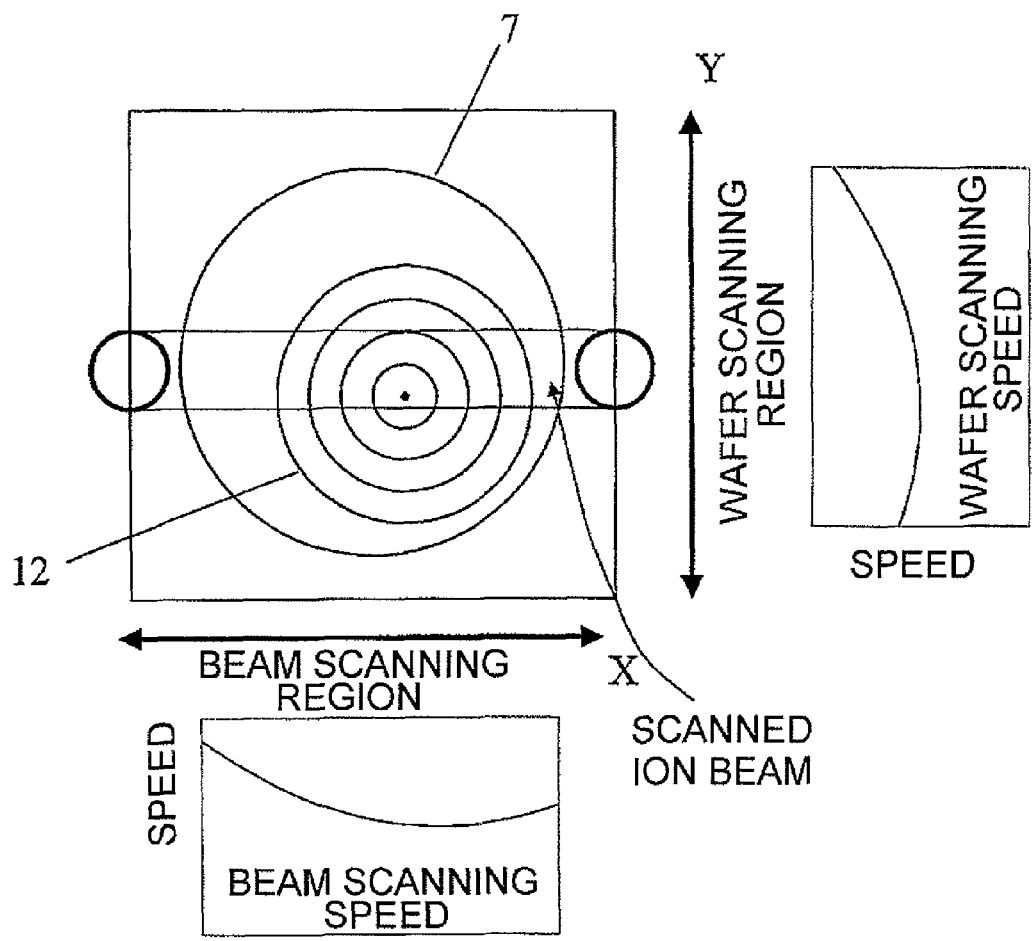
FIG. 8 is a diagram illustrating a first example of the ion implantation method of intentionally forming a non-uniform two-dimensional ion implantation amount in-surface distribution of an eccentric shape in the wafer surface according to a preferred embodiment of the present invention.
Figure 9:
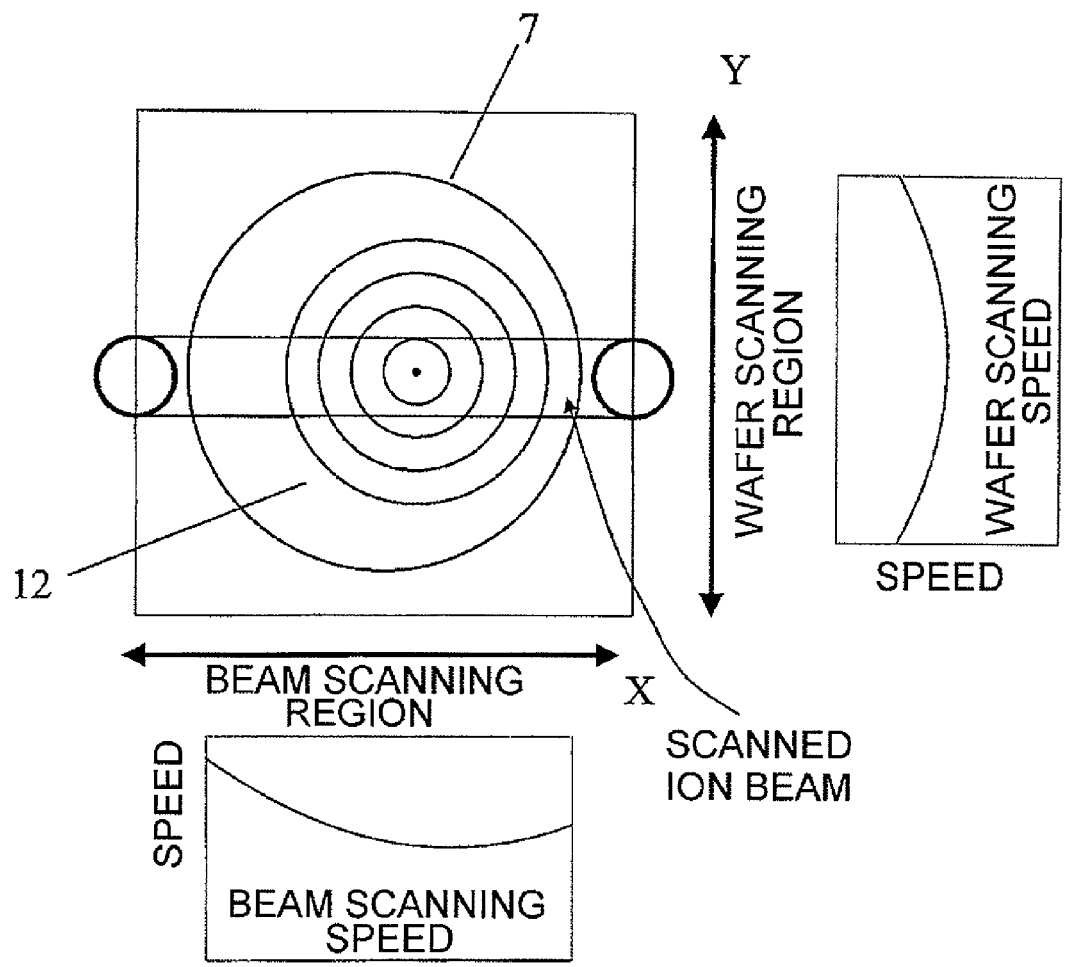
FIG. 9 is a diagram illustrating a second example of the ion implantation method of intentionally forming a non-uniform two-dimensional ion implantation amount in-surface distribution of an eccentric shape in the wafer surface according to a preferred embodiment of the present invention.
Figure 10:
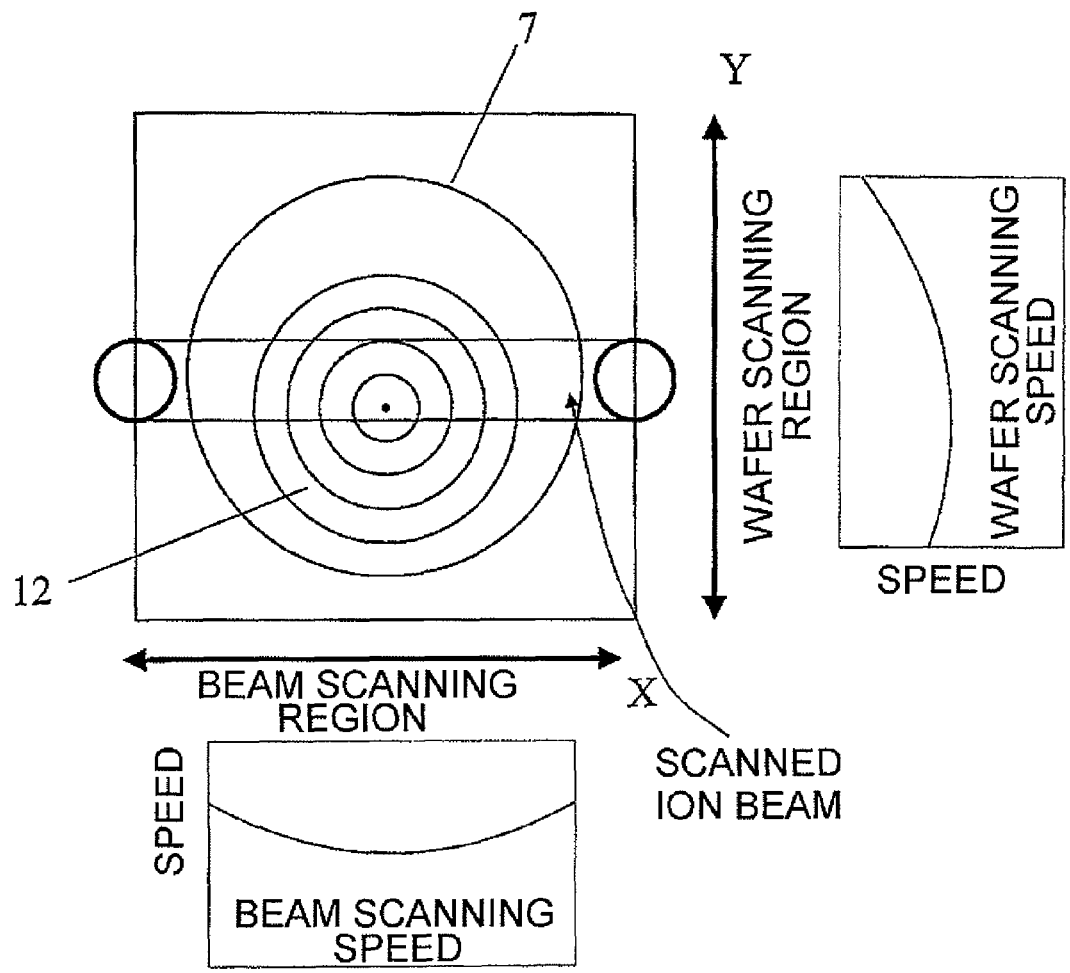
FIG. 10 is a diagram illustrating a third example of the ion implantation method of intentionally forming a non-uniform two-dimensional ion implantation amount in-surface distribution of an eccentric shape in the wafer surface according to a preferred embodiment of the present invention.

As conceptually described in FIG. 13, the intentional non-uniform two-dimensional ion implantation amount in-surface distribution 12 of the concentric circle shape shown in FIG. 8 is a continuous and smooth ion implantation amount in-surface distribution. FIG. 8 schematically shows a contour distribution thereof, and does not show that the distribution is divided into the inside and the outside with reference to the boundary line.

In addition, the beam scanning speed correction amount and wafer scanning speed correction amount may have a small correction amount at the center of the eccentric shape as shown in FIG. 8, or conversely may have a large correction amount at the center of the eccentric shape.

In addition, instead of defining the quadratic function type correction amount, a cosine type correction amount may be defined using a distance from the set arbitrary point in the wafer surface as a variable, and a correction amount distribution where proportional constants of terms proportional to the distance from the arbitrary point in the wafer surface are the same may be used. In this case, the cosine type beam scanning speed correction amount and wafer scanning speed correction amount may have a small correction amount at the center of the eccentric shape, or conversely may have a large correction amount at the center of the eccentric shape.

In the ion implantation method according to the preferred embodiment of the present invention, a description will be described made of the reason why, in relation to the beam scanning speed correction amount in the ion beam scanning direction and the wafer scanning speed correction amount in the mechanical scanning direction, an arbitrary point is set in the wafer surface, a quadratic function type or cosine type correction amount is defined using a distance from the set arbitrary point in the wafer surface as a variable, a correction amount distribution where proportional constants of terms proportional to the square of the distance in the ion beam scanning direction and the mechanical scanning direction are the same is used in a case of the quadratic function type, and a correction amount distribution where proportional constants of terms proportional to the distance from the arbitrary point in the wafer surface in the ion beam scanning direction and the mechanical scanning direction, thereby creating the intentional non-uniform two-dimensional ion implantation amount in-surface distribution 12 of the eccentric shape in the wafer surface. Here, although the description is made using a planar coordinate in the ion beam scanning direction as an X coordinate, and a planar coordinate in the mechanical scanning direction as a Y coordinate, a method of taking coordinates in the plane is not limited thereto, and even if a planar coordinate in the ion beam scanning direction is used as a Y coordinate, and a planar coordinate in the mechanical scanning direction is used as an X coordinate, a result is the same. Further, for convenience of description, the case of the quadratic function type will be described first.

As described above, since the ion implantation apparatus according to the embodiment of the present invention controls a beam scanning speed correction amount in the ion beam scanning direction and a wafer scanning speed correction amount in the mechanical scanning direction at the same time and independently, the ion implantation amount in-surface distribution $D(x,y)$ in the coordinates $(x,y)$ in the wafer surface is expressed by a product $I(x) \times J(y)$ of the beam scanning speed correction amount and the wafer scanning speed correction amount using the beam scanning speed correction amount $I(x)$ and the wafer scanning speed correction amount $J(y)$.

Here, an arbitrary point set in the wafer surface is assumed to have coordinates $(x_0,y_0)$, the set arbitrary point is used as a center of the eccentric shape, and, in order to create an intentional non-uniform two-dimensional ion implantation amount in-surface distribution of the eccentric shape in the wafer surface using the set arbitrary point $(x_0,y_0)$, when the distance from the arbitrary point $(x_0,y_0)$ is denoted by r, the ion implantation amount in-surface distribution $D(x,y)$ is required to be directly correlated with the distance r from the arbitrary point $(x_0,y_0)$ as a function of the distance r from the arbitrary point $(x_0,y_0)$.

In the ion implantation method according to the preferred embodiment of the present invention, by setting the arbitrary point in the wafer surface, using a quadratic function type correction amount, and using the correction amount distribution where the proportional constants of the terms proportional to the distance from the arbitrary point in the wafer surface in the ion beam scanning direction and the mechanical scanning direction are the same, in relation to the beam scanning speed correction amount in the ion beam scanning direction and the wafer scanning speed correction amount in the mechanical scanning direction, the beam scanning speed correction amount $I(x)$ and the wafer scanning speed correction amount $J(y)$ are given the following correction amounts so as to be correlated with each other. That is to say, $I(x)=A\pm B(x-x_0)^2$, and $J(y)=A\pm B(y-y_0)^2$. Here, A and B are constants.

As such, by setting the arbitrary point $(x_0,y_0)$ in the wafer surface, using the quadratic function type correction amount, and using the correction amount distribution where the proportional constants of the terms proportional to the distance from the arbitrary point $(x_0,y_0)$ in the wafer surface in the ion beam scanning direction and the mechanical scanning direction are the same, in relation to the beam scanning speed correction amount in the ion beam scanning direction and the wafer scanning speed correction amount in the mechanical scanning direction, the ion implantation amount in-surface distribution $D(x,y)$ in the coordinates $(x,y)$ in the wafer surface is expressed by $D(x,y)=\{A\pm B(x-x_0)^2\}\times\{A\pm B(y-y_0)^2\}$. When this equation is expanded, and the minute terms are disregarded, the equation can be transformed into $D(x,y)=A\times\{A\pm B((x-x_0)^2+(y-y_0)^2)\}$. Here, the distance r from the arbitrary point $(x_0,y_0)$ has a relationship of $r^2=(x-x_0)^2+(y-y_0)^2$ with the wafer X coordinate and the wafer Y coordinate, and the ion implantation amount in-surface distribution $D(x,y)$ in the coordinates $(x,y)$ in the wafer surface can be transformed into $D(r)=A\times\{A\pm B(r^2)\}$.

In the ion implantation method according to the preferred embodiment of the present invention, even in a case where, in relation to the beam scanning speed correction amount in the ion beam scanning direction and the wafer scanning speed correction amount in the mechanical scanning direction, an arbitrary point is set in the wafer surface, a cosine type correction amount is defined using a distance from the set arbitrary point in the wafer surface as a variable, when the Taylor expansion is performed for the cosine function, and terms other than the expanded first term and second term which are principal terms are disregarded as minute terms, a result similar to the quadratic function type correction amount can be obtained.

As such, in a case where, in relation to the beam scanning speed correction amount in the ion beam scanning direction and the wafer scanning speed correction amount in the mechanical scanning direction, an arbitrary point is set in the wafer surface, a quadratic function type or cosine type correction amount is defined using a distance from the set arbitrary point in the wafer surface as a variable, a correction amount distribution where proportional constants of terms proportional to the square of the distance in the ion beam scanning direction and the mechanical scanning direction are the same is used in a case of the quadratic function type, and a correction amount distribution where proportional constants of terms proportional to the distance from the arbitrary point in the wafer surface in the ion beam scanning direction and the mechanical scanning direction are the same is used in a case of the cosine type, the ion implantation amount in-surface distribution mathematically becomes a function of the distance r from the arbitrary point as $D(r)$ and thus can be directly correlated with the distance r from the arbitrary point. Therefore, it is possible to create an intentional non-uniform two-dimensional ion implantation amount in-surface distribution of the eccentric shape in the wafer surface.

In a case of using types of correction amounts other than the correction amount shown in the preferred embodiment of the present invention, influence of the ion beam scanning direction and the wafer scanning direction is left on the ion implantation amount pattern which can be realized in the wafer surface, and thereby a rectangular shape necessarily has influence. Therefore, an intentional non-uniform two-dimensional ion implantation amount in-surface distribution of the eccentric shape cannot be created in the wafer surface.

In the ion implantation method according to the preferred embodiment of the present invention, by changing a proportional constant of the term proportional to the square of the distance and the constant term in a case of using the quadratic function type correction amount, and by changing a proportional constant of the term proportional to the distance from the arbitrary center in the wafer surface in a case of using the cosine type correction amount, it is possible to change correction amount intensity in the ion implantation surface in a non-uniform two-dimensional ion implantation amount in-surface distribution of the eccentric shape which is intentionally created in the wafer surface.

In the ion implantation method according to the preferred embodiment of the present invention, a central position of the eccentric shape may be set at an arbitrary point in the wafer surface. In other words, when a planar coordinate in the ion beam scanning direction is an X coordinate, and a planar coordinate in the mechanical scanning direction is a Y coordinate, the central position may be set at a position other than the X axis and Y axis as in FIG. 8, may be set on the X axis as in FIG. 9, or may be set on the Y axis as in FIG. 10.

As above, according to the preferred embodiment of the present invention, in the apparatus which reciprocally scans an ion beam, mechanically scans a wafer in a direction which is substantially perpendicular to the beam scanning direction, and injects ions into the wafer, in a case where, in order to correct non-uniformity in the wafer surface in the other semiconductor manufacturing processes, a beam scanning speed in the ion beam scanning direction and a wafer scanning speed in the mechanical scanning direction are controlled at the same time and independently, and ion implantation is performed without using step rotation implantation of the wafer, if an arbitrary point is set in the wafer surface and the point is regarded as a rotation center, it is possible to realize an ion implantation amount distribution of an isotropic concentric circle shape with respect to the rotation center without angular direction dependency from the point of the ion implantation amount in the wafer surface, that is, an ion implantation amount distribution of an eccentric shape with respect to the wafer.

Next, an ion implantation method where a beam scanning speed correction amount in the ion beam scanning direction and a wafer scanning speed correction amount in the mechanical scanning direction are correlated with each other, and an intentional non-uniform two-dimensional ion implantation amount in-surface distribution 13 of the elliptical shape is created in the wafer surface, will be described with reference to FIG. 11. As described in FIG. 4, if an ion implantation amount implanted into the wafer 7 is to be considered, for convenience of understanding, assuming that the wafer 7 stops, the beam scanning speed and the wafer scanning speed may be considered relatively. Therefore, in FIG. 11 as well, for convenience of understanding, the wafer 7 is shown as if it stops.

In the preferred embodiment (third preferred embodiment) of the present invention, by using a predefined method where a quadratic function type is defined using a distance from the wafer center as a variable, and a correction amount distribution where proportional constants of terms proportional to the square of the distance in the ion beam scanning direction and the mechanical scanning direction are different is used, a beam scanning speed correction amount and a wafer scanning speed correction amount are correlated with each other, and thereby an intentional non-uniform two-dimensional ion implantation amount in-surface distribution 13 of the elliptical shape is created in the wafer surface.

Figure 11:
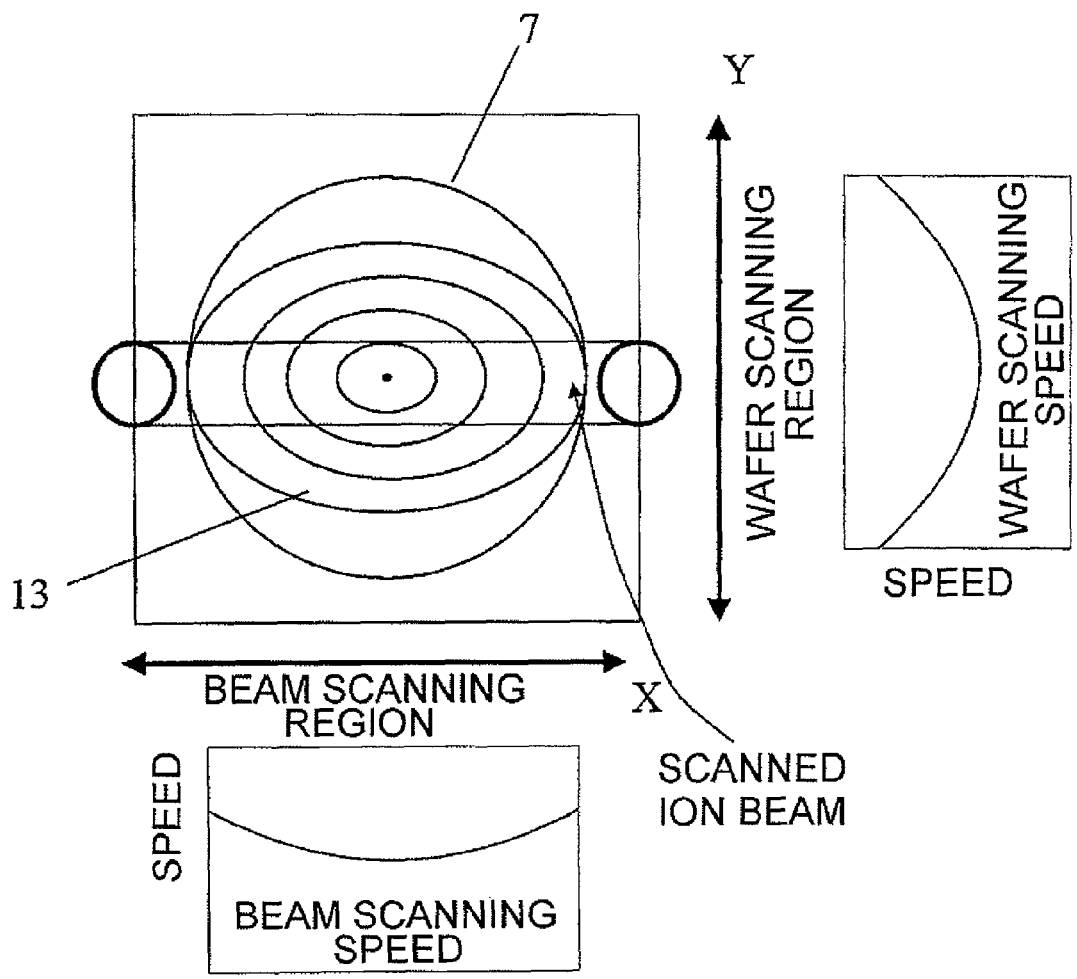
FIG. 11 is a diagram illustrating an example of the ion implantation method of intentionally forming a non-uniform two-dimensional ion implantation amount in-surface distribution of an elliptical shape in the wafer surface according to a preferred embodiment of the present invention.

As conceptually described in FIG. 13, the intentional non-uniform two-dimensional ion implantation amount in-surface distribution 13 of the elliptical shape shown in FIG. 11 is a continuous and smooth ion implantation amount in-surface distribution. FIG. 11 schematically shows a contour distribution thereof, and does not show that the distribution is divided into the inside and the outside with reference to the boundary line.

In addition, the beam scanning speed correction amount and the wafer scanning speed correction amount may have a small correction amount at the wafer center as shown in FIG. 11, or conversely may have a large correction amount at the wafer center.

In addition, instead of defining the quadratic function type correction amount, a cosine type correction amount may be defined using a distance from the wafer center as a variable, and a correction amount distribution where proportional constants of terms proportional to the distance from the wafer center are different may be used. In this case, the cosine type beam scanning speed correction amount and wafer scanning speed correction amount may have a small correction amount at the wafer center, or conversely may have a large correction amount at the wafer center.

In the ion implantation method according to the preferred embodiment of the present invention, a description will be made of the reason why, in relation to the beam scanning speed correction amount in the ion beam scanning direction and the wafer scanning speed correction amount in the mechanical scanning direction, a quadratic function type or cosine type correction amount is defined using a distance from the wafer center as a variable, a correction amount distribution where proportional constants of terms proportional to the square of the distance in the ion beam scanning direction and the mechanical scanning direction are different is used in a case of the quadratic function type, and a correction amount distribution where proportional constants of terms proportional to the distance from the wafer center in the ion beam scanning direction and the mechanical scanning direction are different is used in a case of the cosine type, thereby creating the intentional non-uniform two-dimensional ion implantation amount in-surface distribution 13 of the elliptical shape in the wafer surface. Here, although the description is made using a planar coordinate in the ion beam scanning direction as an X coordinate, and a planar coordinate in the mechanical scanning direction as a Y coordinate, a method of taking coordinates in the plane is not limited thereto, and even if a planar coordinate in the ion beam scanning direction is used as a Y coordinate, and a planar coordinate in the mechanical scanning direction is used as an X coordinate, a result is the same. Further, for convenience of description, the case of the quadratic function type will be described first.

As described above, since the ion implantation apparatus according to the preferred embodiment of the present invention controls a beam scanning speed correction amount in the ion beam scanning direction and a wafer scanning speed correction amount in the mechanical scanning direction at the same time and independently, the ion implantation amount in-surface distribution $D(x,y)$ in the coordinates $(x,y)$ in the wafer surface is expressed by a product $I(x) \times J(y)$ of the beam scanning speed correction amount and the wafer scanning speed correction amount using the beam scanning speed correction amount $I(x)$ and the wafer scanning speed correction amount $J(y)$.

In order to create the intentional non-uniform two-dimensional ion implantation amount in-surface distribution of the elliptical shape in the wafer surface, the ion implantation amount in-surface distribution $D(x,y)$ is required to satisfy a planar equation of the elliptical shape.

In the ion implantation method according to the preferred embodiment of the present invention, by setting the arbitrary point in the wafer surface, using a quadratic function type correction amount, and using the correction amount distribution where the proportional constants of the terms proportional to the square of the distance in the ion beam scanning direction and the mechanical scanning direction are different, in relation to the beam scanning speed correction amount in the ion beam scanning direction and the wafer scanning speed correction amount in the mechanical scanning direction, the beam scanning speed correction amount $I(x)$ and the wafer scanning speed correction amount $J(y)$ are given the following correction amounts so as to be correlated with each other. That is to say, $I(x)=A \pm Bx^2$, and $J(y)=A \pm Cy^2$. Here, A, B, and C are constants.

As such, by using the quadratic function type correction amount, and using the correction amount distribution where the proportional constants of the terms proportional to the square in the ion beam scanning direction and the mechanical scanning direction are different, in relation to the beam scanning speed correction amount in the ion beam scanning direction and the wafer scanning speed correction amount in the mechanical scanning direction, the ion implantation amount in-surface distribution $D(x,y)$ in the coordinates $(x,y)$ in the wafer surface is expressed by $D(x,y)=(A \pm Bx^2) \times (A \pm Cy^2)$. When this equation is expanded, and the minute terms are disregarded, the equation can be transformed into $D(x,y)=A \times (A \pm (Bx^2+Cy^2))$. Here, the planar equation of the elliptical shape is $Bx^2+Cy^2$, and thus it can be said that the ion implantation amount in-surface distribution $D(x,y)$ in the coordinates $(x,y)$ in the wafer surface indicates the elliptical shape.

In the ion implantation method according to the preferred embodiment of the present invention, even in a case where, in relation to the beam scanning speed correction amount in the ion beam scanning direction and the wafer scanning speed correction amount in the mechanical scanning direction, a cosine type correction amount is defined using a distance from wafer center as a variable, when the Taylor expansion is performed for the cosine function, and terms other than the expanded first term and second term which are principal terms are disregarded as minute terms, a result similar to the quadratic function type correction amount can be obtained.

As such, in a case where, in relation to the beam scanning speed correction amount in the ion beam scanning direction and the wafer scanning speed correction amount in the mechanical scanning direction, a quadratic function type or cosine type correction amount is defined using a distance from the wafer center as a variable, a correction amount distribution where proportional constants of terms proportional to the square of the distance in the ion beam scanning direction and the mechanical scanning direction are different is used in a case of the quadratic function type, and a correction amount distribution where proportional constants of terms proportional to the distance from wafer center in the ion beam scanning direction and the mechanical scanning direction are different is used in a case of the cosine type, the ion implantation amount in-surface distribution $D(x,y)$ mathematically indicates the elliptical shape so as to be correlated with the planar equation. Therefore, it is possible to create an intentional non-uniform two-dimensional ion implantation amount in-surface distribution of the elliptical shape in the wafer surface.

In a case of using types of correction amounts other than the correction amount shown in the preferred embodiment of the present invention, influence of the ion beam scanning direction and the wafer scanning direction is left on the ion implantation amount pattern which can be realized in the wafer surface, and thereby a rectangular shape necessarily has influence. Therefore, an intentional non-uniform two-dimensional ion implantation amount in-surface distribution of the elliptical shape cannot be created in the wafer surface.

In the ion implantation method according to the preferred embodiment of the present invention, by changing a proportional constant of the term proportional to the square of the distance and the constant term in a case of using the quadratic function type correction amount, and by changing a proportional constant of the term proportional to the distance from the wafer center in a case of using the cosine type correction amount, it is possible to change correction amount intensity in the ion implantation surface in a non-uniform two-dimensional ion implantation amount in-surface distribution of the elliptical shape which is intentionally created in the wafer surface.

The ion implantation method according to the preferred embodiment of the present invention has no limitation on the magnitude correlation of proportional constants set in the ion beam scanning direction and the mechanical scanning direction, and thus the major axis direction of the elliptical shape may be set in the ion beam scanning direction as in FIG. 11, or may be set in the wafer scanning direction.

As above, according to the preferred embodiment of the present invention, in the apparatus which reciprocally scans an ion beam, mechanically scans a wafer in a direction which is substantially perpendicular to the beam scanning direction, and implants ions into the wafer, in a case where, in order to correct non-uniformity in the wafer surface in the other semiconductor manufacturing processes, a beam scanning speed in the ion beam scanning direction and a wafer scanning speed in the mechanical scanning direction are controlled at the same time and independently, and ion implantation is performed without using the step rotation implantation of the wafer, it is possible to realize an ion implantation amount distribution of the elliptical shape in the wafer surface.

To summarize the above description, according to the first through third preferred embodiments of the present invention, in the ion implantation apparatus which reciprocally scans an ion beam, mechanically scans a wafer in a direction which is substantially perpendicular to the beam scanning direction, and implants ions into the wafer, it is possible to realize an intentional non-uniform two-dimensional ion implantation amount in-surface distribution of the concentric circle shape, the eccentric shape, or the elliptical shape without using the step rotation of the wafer.

In addition, the above-described preferred embodiments and the description thereof are only an example and are not intended as limitations, and the following examples may be considered as further examples.

For example, in ion implantation processes using the ion implantation method of reciprocally scanning an ion beam, mechanically scanning the wafer in a direction substantially perpendicular to the beam scanning direction, and implanting ions into the wafer, in a case of correcting non-uniformity in the wafer surface in the other semiconductor manufacturing processes by performing ion implantation without using the step rotation of the wafer in each of the ion implantation processes, it is possible to realize a plurality of ion implantation processes for achieving an ion implantation amount which realizes an ion implantation amount distribution of an isotropic concentric circle shape having constant ion implantation amount in-surface correction amount intensity without leaving influence of the ion beam scanning direction and the wafer scanning direction.

Specifically, in the respective ion implantation processes, in a case of correcting non-uniformity in the wafer surface in the other semiconductor manufacturing processes by performing ion implantation without using the step rotation of the wafer, an arbitrary point is set in the wafer surface while maintaining the intensity of the ion implantation amount in-surface distribution to be constant in a plurality of ion implantation processes which are different from each other between 0 degrees to 179 degrees which are rotation angles with respect to an ion beam. If the point is regarded as a rotation center, it is possible to realize an ion implantation process which realizes an ion implantation amount distribution of an isotropic concentric circle shape with respect to the rotation center such that the ion implantation amount is not dependent on an angular direction from the point.

In this case, it is possible to realize an ion implantation amount which realizes an ion implantation amount distribution of an isotropic concentric circle shape at all times regardless of the clockwise rotation and the counterclockwise rotation in the wafer rotation angular direction.

On the other hand, the same effects can be achieved in a plurality of ion implantation processes which are different from each other between −179 degrees and 0 degrees which are wafer rotation angles with reference to ion beams instead of 0 degrees to 179 degrees which are wafer rotation angles with respect to the ion beams.

In addition, in the respective ion implantation processes using the ion implantation method of reciprocally scanning ion beams, mechanically scanning the wafer in a direction substantially perpendicular to the beam scanning direction, and implanting ions into the wafer, in a case of correcting non-uniformity in the wafer surface in the other semiconductor manufacturing processes by performing ion implantation without using the step rotation of the wafer in each of the ion implantation processes, it is possible to realize a plurality of ion implantation processes for achieving an ion implantation amount which realizes an ion implantation amount distribution of an eccentric shape having constant ion implantation amount in-surface correction amount intensity without leaving influence of the ion beam scanning direction and the wafer scanning direction.

As described above, a central position of the eccentric shape can be set at any position in the wafer surface, and ion implantation amount in-surface correction amount intensity can be made to be constant in the ion implantation processes. Therefore, when the ion implantation method according to the preferred embodiments of the present invention is used, in the respective ion implantation processes using the ion implantation method of scanning an ion beam, mechanically scanning the wafer in a direction substantially perpendicular to the beam scanning direction, and implanting ions into the wafer, in a case of correcting non-uniformity in the wafer surface in the other semiconductor manufacturing processes by performing ion implantation without using the step rotation of the wafer in each of the ion implantation processes, it is possible to realize a plurality of ion implantation processes for achieving an ion implantation amount which realizes an ion implantation amount distribution of an isotropic eccentric shape having constant ion implantation amount in-surface correction amount intensity and having a center of the eccentric shape at spatially identical positions in the wafer surface without leaving influence of the ion beam scanning direction and the wafer scanning direction.

It should be understood that the invention is not limited to the above-described embodiment, but may be modified into various forms on the basis of the spirit of the invention. Additionally, the modifications are included in the scope of the invention.

What is claimed is:

1. An ion implantation method comprising:
reciprocally scanning an ion beam;
mechanically scanning a wafer in a direction perpendicular to an ion beam scanning direction;
implanting ions into the wafer; and
generating an ion implantation amount distribution in a wafer surface of an elliptical shape for correcting non-uniformity in the wafer surface in other semiconductor manufacturing processes, by performing speed control of a beam scanning speed in the ion beam scanning direction and a wafer scanning speed in a mechanical scanning direction at the same time and independently using the respective control functions defining speed correction amounts.

2. The ion implantation method according to claim 1, wherein, when the speed control is performed, in relation to a beam scanning speed correction amount in the ion beam scanning direction and a wafer scanning speed correction amount in the mechanical scanning direction, a distance from a wafer center is used as a variable, a sum of or a difference between a term proportional to the square of the distance and a constant term is used as a correction amount, and a correction amount distribution where proportional constants of the terms proportional to the square of the distance in the ion beam scanning direction and the mechanical scanning direction are different is used.

3. The ion implantation method according to claim 1, wherein, when the speed control is performed, in relation to a beam scanning speed correction amount in the ion beam scanning direction and a wafer scanning speed correction amount in the mechanical scanning direction, a distance from a wafer center is used as a variable, a characteristic function created from a sum of or a difference between a term proportional to the square of the distance and a constant term is used as the control function, and a characteristic function where proportional constants of the terms proportional to the square of the distance in the ion beam scanning direction and the mechanical scanning direction are different is used.

4. The ion implantation method according to claim 1, wherein, when the speed control is performed, in relation to a beam scanning speed correction amount in the ion beam scanning direction and a wafer scanning speed correction amount in the mechanical scanning direction, a distance from a wafer center is used as a variable, a sum of or a difference between a term of a cosine function value of a term proportional to the variable and a constant term is used as a correction amount, and a correction amount distribution where proportional constants of the terms proportional to the distance from the wafer center in the ion beam scanning direction and the mechanical scanning direction are different is used.

5. The ion implantation method according to claim 1, wherein, when the speed control is performed, in relation to a beam scanning speed correction amount in the ion beam scanning direction and a wafer scanning speed correction amount in the mechanical scanning direction, a distance from a wafer center is used as a variable, a characteristic function created from a sum of or a difference between a term of a cosine function value of a term proportional to the variable and a constant term is used as the control function, and a characteristic function where proportional constants of the terms proportional to the distance from the wafer center in the ion beam scanning direction and the mechanical scanning direction are different is used.

6. An ion implantation apparatus which implants ions into a wafer, comprising a control system that reciprocally scans an ion beam and mechanically scans the wafer in a direction perpendicular to an ion beam scanning direction, wherein the control system generates an ion implantation amount distribution in a wafer surface of an elliptical shape for correcting non-uniformity in the wafer surface in other semiconductor manufacturing processes, by performing speed control of a beam scanning speed in the ion beam scanning direction and a wafer scanning speed in a mechanical scanning direction at the same time and independently using the respective control functions defining speed correction amounts.

* * * * *